(12) United States Patent
Son et al.

(10) Patent No.: US 9,941,476 B2
(45) Date of Patent: Apr. 10, 2018

(54) CONDUCTIVE ORGANIC SEMICONDUCTOR COMPOUND, METHOD FOR PREPARING THE SAME AND ORGANIC THIN-FILM TRANSISTOR INCLUDING THE SAME

(71) Applicant: KOREA INSTITUTE OF SCIENCE AND TECHNOLOGY, Seoul (KR)

(72) Inventors: Hae Jung Son, Seoul (KR); Min Jae Ko, Seoul (KR); Bong Soo Kim, Seoul (KR); Doh-Kwon Lee, Seoul (KR); Jin Young Kim, Seoul (KR); Hong Gon Kim, Seoul (KR); Sungmin Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 281 days.

(21) Appl. No.: 14/659,809

(22) Filed: Mar. 17, 2015

(65) Prior Publication Data
US 2016/0149137 A1  May 26, 2016

(30) Foreign Application Priority Data

Nov. 21, 2014 (KR) ........................ 10-2014-0163341

(51) Int. Cl.
| | | |
|---|---|---|
| H01L 51/00 | (2006.01) | |
| C08G 61/12 | (2006.01) | |
| H01L 51/05 | (2006.01) | |

(52) U.S. Cl.
CPC ........ H01L 51/0036 (2013.01); C08G 61/123 (2013.01); C08G 61/124 (2013.01); C08G 61/126 (2013.01); H01L 51/0035 (2013.01); *C08G 2261/12* (2013.01); *C08G 2261/146* (2013.01); *C08G 2261/1412* (2013.01); *C08G 2261/18* (2013.01); *C08G 2261/3223* (2013.01); *C08G 2261/3229* (2013.01); *C08G 2261/3241* (2013.01); *C08G 2261/3243* (2013.01); *C08G 2261/3245* (2013.01); *C08G 2261/3246* (2013.01); *C08G 2261/334* (2013.01); *C08G 2261/344* (2013.01); *C08G 2261/364* (2013.01); *C08G 2261/414* (2013.01); *C08G 2261/592* (2013.01); *C08G 2261/92* (2013.01);
(Continued)

(58) Field of Classification Search
CPC ............ H01L 51/0036; H01L 51/0035; C08G 61/123; C08G 61/126; C08G 61/124
See application file for complete search history.

(56) References Cited

PUBLICATIONS

Anthopoulos et al.,High performance n-channel organic field-effect transistors and ring oscillators based on C60 fullerene films, Applied Physics Letters, Nov. 20, 2006, pp. 213504-1-213504-3, vol. 89, American Institute of Physics.
(Continued)

*Primary Examiner* — John P Dulka
(74) *Attorney, Agent, or Firm* — Goldilocks Zone IP Law

(57) ABSTRACT

The present disclosure provides an organic semiconductor compound, which has superior charge mobility, low band gap, wide light absorption area and adequate molecular energy level. The conductive organic semiconductor compound of the present disclosure can be used as a material for various organic optoelectric devices such as an organic photodiode (OPD), an organic light-emitting diode (OLED), an organic thin-film transistor (OTFT), an organic solar cell, etc. In addition, it can be prepared into a thin film via a solution process, can be advantageously used to fabricate large-area devices and can reduce the cost of device fabrication.

12 Claims, 6 Drawing Sheets

(52) U.S. Cl.
CPC ...... *H01L 51/0545* (2013.01); *H01L 51/0558* (2013.01); *Y02E 10/549* (2013.01)

(56) References Cited

PUBLICATIONS

Lei et al. A BDOPV-Based Donor-Acceptor Polymer for High-Performance n-Type and Oxygen-Doped Ambipolar Field-Effect Transistors,Advanced Materials, Aug. 23, 2013, pp. 6589-6593, vol. 25, MaterialsView.
Yan et al., A high-mobility electron-transporting polymer for printed transistors, nature, Feb. 5, 2009, pp. 679-688, vol. 457, Macmillan.

CONDUCTIVE ORGANIC SEMICONDUCTOR COMPOUND, METHOD FOR PREPARING THE SAME AND ORGANIC THIN-FILM TRANSISTOR INCLUDING THE SAME

CROSS-REFERENCE TO RELATED APPLICATIONS

This application claims priority under 35 U.S.C. § 119 to Korean Patent Application No. 10-2014-0163341 filed on Nov. 21, 2014 in the Korean Intellectual Property Office, the disclosure of which is incorporated herein by reference in its entirety.

TECHNICAL FIELD

The present disclosure relates to a novel organic semiconductor compound containing difluorothiophene, more particularly to a new n-type organic semiconductor compound having high solubility and thermal stability, a method for preparing the same and various uses thereof.

BACKGROUND

The advent of organic semiconductors has enabled fabrication on a flexible plastic substrate and thus realization of a flexible display. Since it was reported that a conjugated polymer exhibits semiconductor properties and an electrical conductivity comparable to that of a metal can be achieved by doping it, the organic semiconductors are being developed more actively.

Recently, many researches are being conducted on organic light emitting diodes that can be used for various mobile electronic devices and on organic thin-film transistors wherein even the devices for driving the light emitting diodes are replaced by organic materials.

The organic thin-film transistor is advantageous over the thin-film transistor using amorphous silicon or polysilicon in that it can be fabricated at low cost via a simple process and is excellently compatible with plastic substrates used to fabricate flexible displays. In particular, when an organic semiconductor material with superior solubility is used, a thin film can be prepared easily via a solution process, which allows for preparation with large area at much lower cost.

The existing general organic thin-film transistor has a structure of substrate/gate electrode/insulating layer/electrode (source and drain) layers/organic semiconductor layer. A gate electrode is formed on a substrate, an insulating layer is formed on the gate electrode, and an organic semiconductor layer, a source electrode and a drain electrode are formed sequentially on the insulating layer. When an organic semiconductor is used as an n-type semiconductor in the organic thin-film transistor having such a structure, if a low voltage is applied between the source and drain electrodes, a current proportional to the applied voltage flows. At this time, if a negative voltage is applied to the gate electrode, electrons having negative charge are forced to the upper organic semiconductor layer due to the electric field formed by the voltage. As a result, a depletion layer without conductive charges is formed near the insulating layer. In this situation, even when a voltage is applied between the source and drain electrodes, the current is low because of decreased amount of conductive charge carriers. Conversely, if a positive voltage is applied to the gate electrode, a negatively charged accumulation layer is formed near the insulating layer due to the electric field formed by the applied voltage. In this case, a large current can flow because there are many conductive charge carriers between the source and drain electrodes. Accordingly, the current flowing between the source and drain electrodes can be controlled by alternatingly applying negative and positive voltages to the gate electrode in the state where a voltage is applied between the source and drain electrodes.

In the existing organic thin-film transistor including the n-type semiconductor operating based on the above-described principle, a substrate and source, drain and gate electrodes with high thermal stability, an insulator with high insulating property (dielectric constant) and an organic semiconductor that allows facile charge transport are required. To overcome the problems of the organic thin-film transistor, there are much to be improved for the materials of the insulator, organic semiconductor, etc. In particular, since the organic semiconductor is the key material, to overcome the problem of the organic semiconductor material will provide a good solution to the problem of the organic thin-film transistor.

Until now, there has been more development in the p-type organic semiconductor materials based on hole transport than that of the n-type semiconductor materials based on electron transport. It is because, since hole mobility is larger than electron mobility in most cases, the n-type organic semiconductor tends to exhibit lower performance and conductivity as compared to the p-type organic semiconductor. Since fullerene ($C_{60}$), which is the representative n-type organic semiconductor material, has low LUMO energy, it can transport electrons well. It is reported that an electron mobility up to 6 $cm^2/V \cdot s$ can be achieved in vacuum. However, if an n-type transistor device is fabricated using the fullerene organic semiconductor material via a solution process, the electron mobility is very low as about $2.8 \times 10^{-2}$ $cm^2/V \cdot s$ (non-patent document 1).

Although an n-type polymer semiconductor having an electron mobility of 1 $cm^2/V \cdot s$ was reported, the electron mobility is still far from commercialization (non-patent document 2). That is to say, there have been little development of a flexible, organic semiconductor material which has superior electron mobility and can be usefully used for a solution process.

To construct circuits such as a p-n junction diode, a bipolar transistor, a transducer, etc. using an organic material, the development of an n-type organic semiconductor material is necessary. Especially, the development of a novel n-type organic semiconductor material that can solve the problems of the existing art is necessary. A superior n-type organic semiconductor that can solve the above-described problems will be usefully applied not only in transistors but also as an electron acceptor material for organic thin-film solar cells.

REFERENCES OF THE RELATED ART

Non-Patent Documents

Non-patent document 1. T. D. Anthopoulos, B. Singh, N. Marjanovic, N. S. Sariciftci, A. M. Ramil, H. Sitter, M. Colle, and D. M. de Leeuw, *Appl. Phys. Lett.*, 89, 213504 (2006).

Non-patent document 2. T. Lei, J.-H. Dou, X.-Y. Cao, J.-Y. Wang, J. Pei, *Adv. Mater.* 25, 6589 (2013); H, Yan1, Z, Chen1, Y, Zheng1, C, Newman1, J. R. Quinn1, F, Dotz, M, Kastler, A. Facchetti, *Nature* 457, 679 (2009).

SUMMARY

The present disclosure is directed to providing a conductive organic semiconductor compound having superior charge mobility, low band gap, wide light absorption area and adequate molecular energy level and a method for preparing the same.

The present disclosure is also directed to providing an organic semiconductor thin film and an organic thin-film transistor using the conductive organic semiconductor compound.

In an aspect, the present disclosure provides a conductive organic semiconductor compound represented by [Chemical Formula I] or [Chemical Formula II]:

[Chemical Formula I]

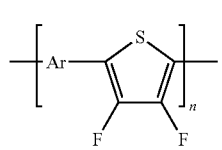

[Chemical Formula II]

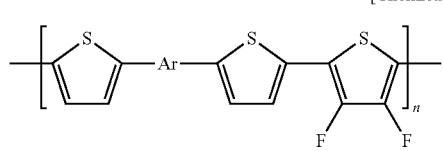

In [Chemical Formula I] and [Chemical Formula II], Ar is selected from [Structural Formula 1]:

[Structural Formula 1]

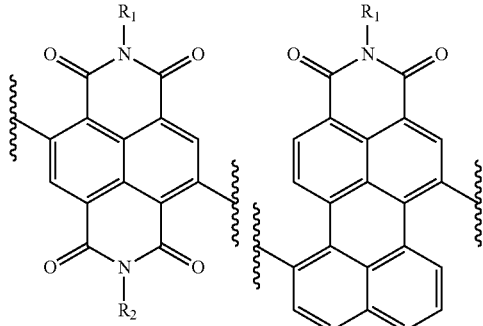

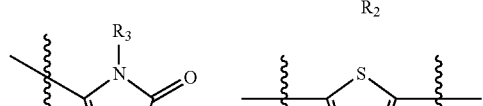

-continued

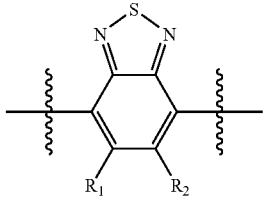

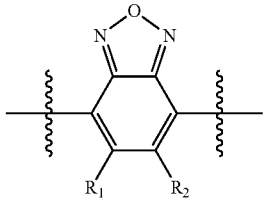

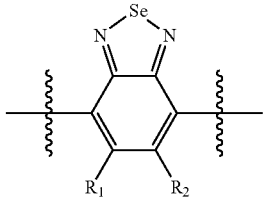

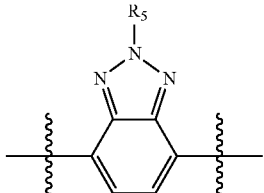

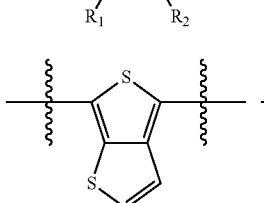

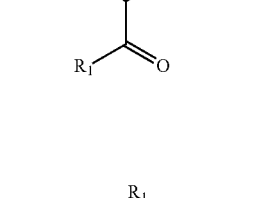

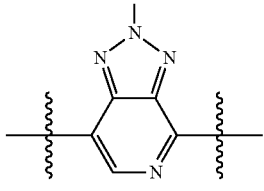

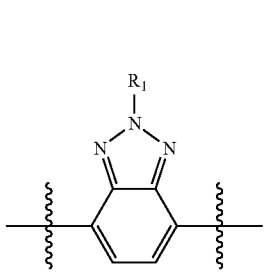

-continued
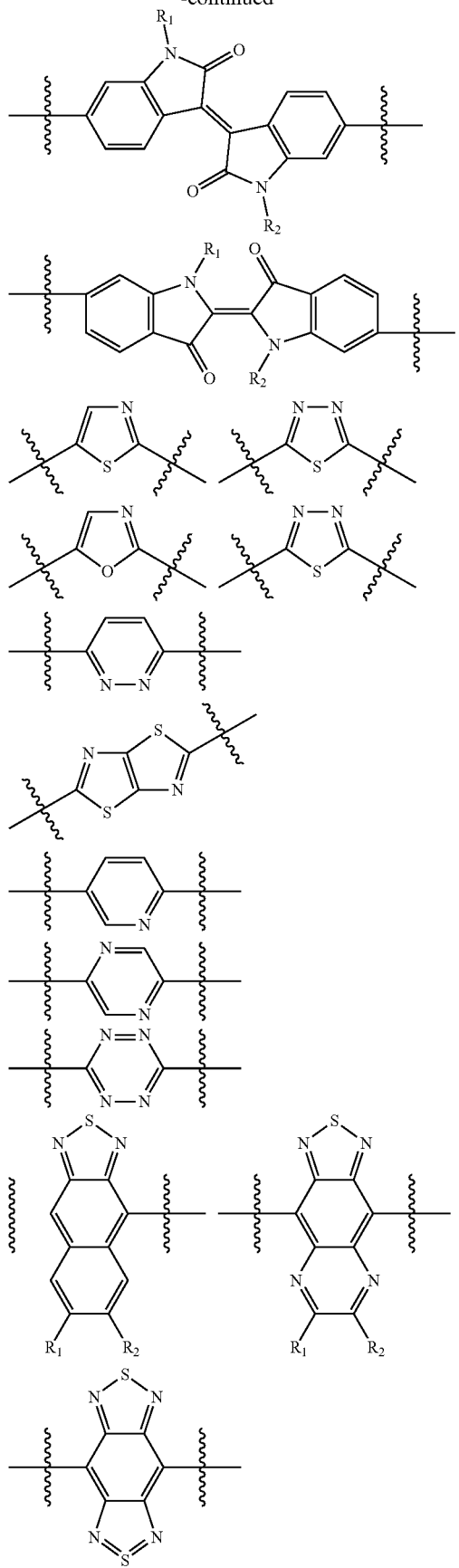
-continued
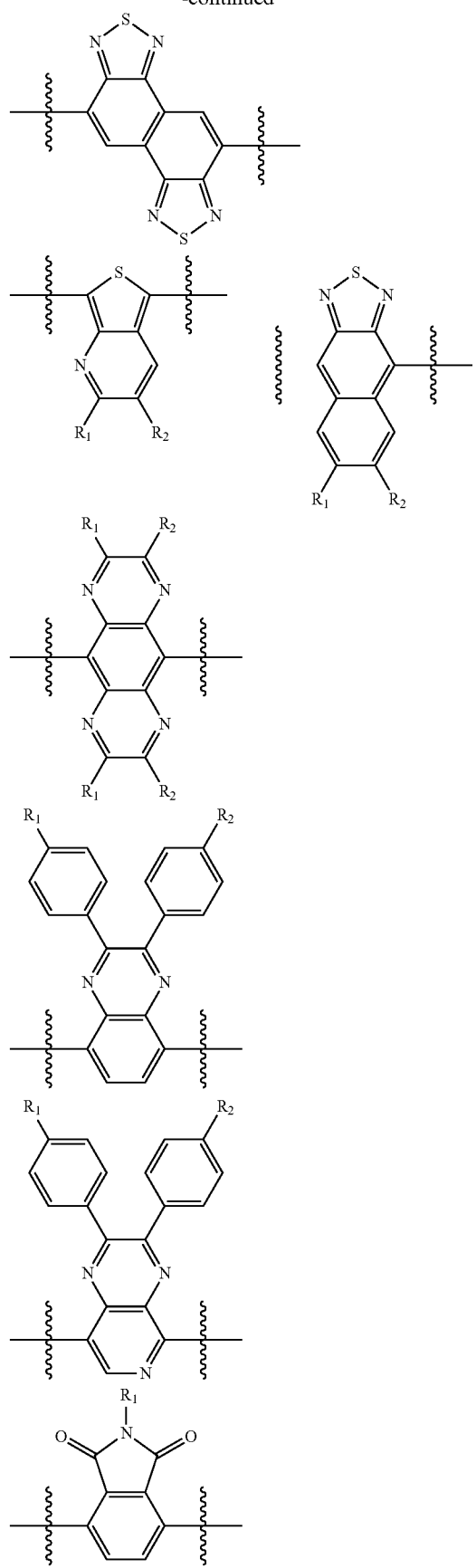

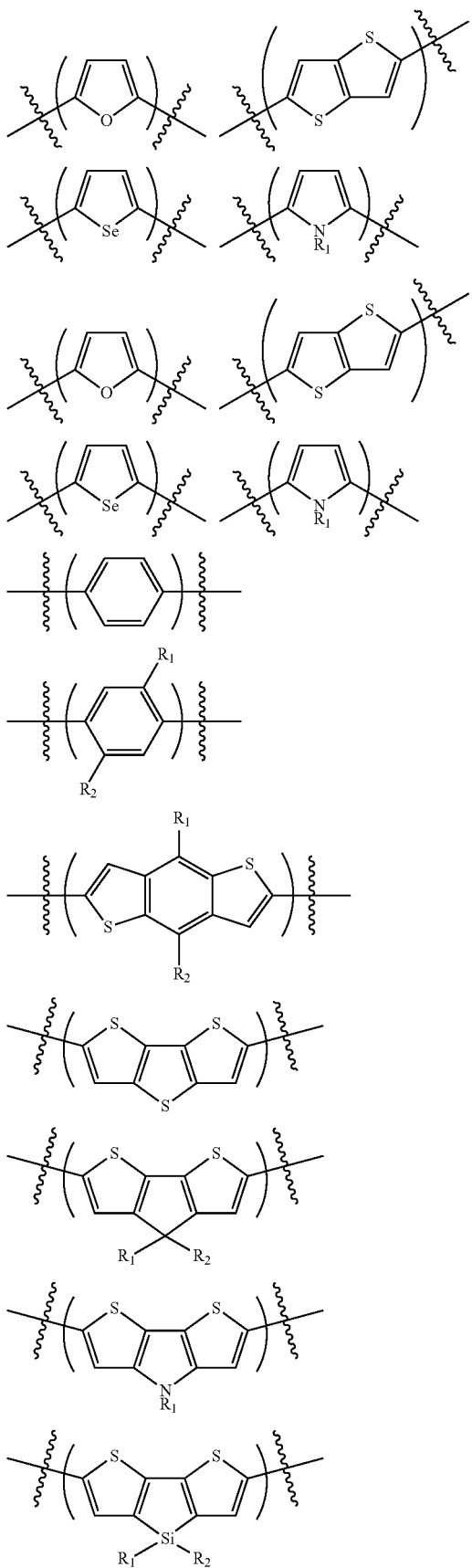

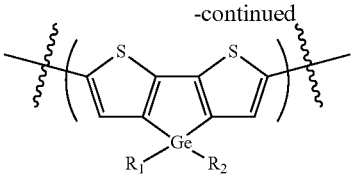

In [Structural Formula 1],
each of $R_1$ and $R_2$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group, and
n is an integer from 5 to 100,000.

[Chemical Formula II] may be represented by [Chemical Formula III] or [Chemical Formula IV]:

[Chemical Formula III]

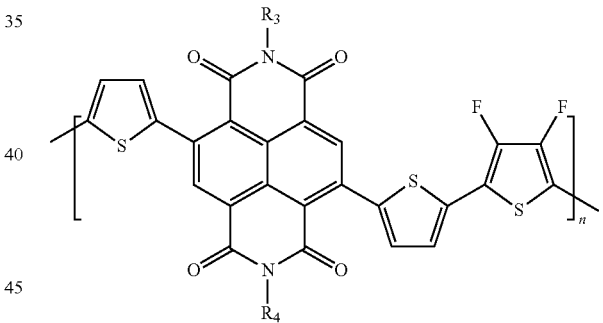

[Chemical Formula IV]

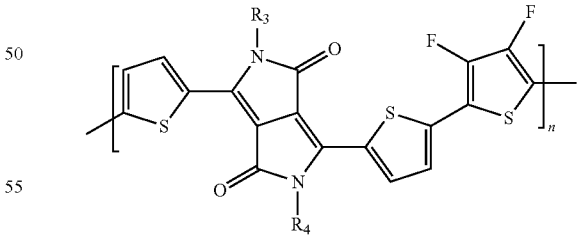

In [Chemical Formula III] and [Chemical Formula IV],
each of $R_3$ and $R_4$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group, and n is an integer from 5 to 100,000.

[Chemical Formula III] may be represented by [Chemical Formula V]:

[Chemical Formula V]

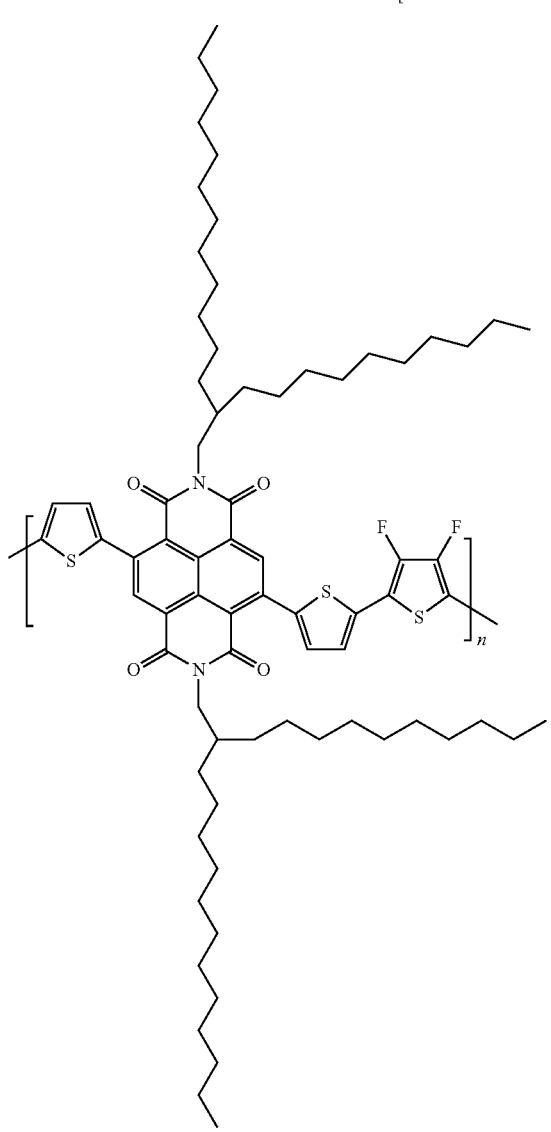

In [Chemical Formula V], n is an integer from 5 to 100,000.

[Chemical Formula IV] may be represented by [Chemical Formula VI]:

[Chemical Formula VI]

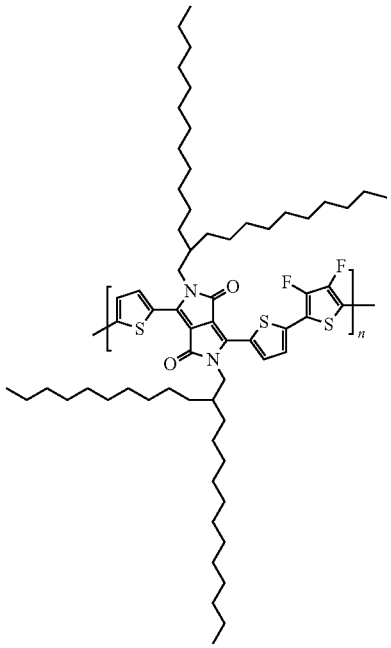

In [Chemical Formula VI], n is an integer from 5 to 100,000.

The conductive organic semiconductor compound may have an electron mobility of $1 \times 10^{-6}$ cm$^2$/V·s or higher.

The conductive organic semiconductor compound may have a band gap of 1.0-3.0 eV.

In another aspect, the present disclosure provides a method for preparing a conductive organic semiconductor compound represented by [Chemical Formula I], including dissolving a compound represented by [Chemical Formula VII] and a compound represented by [Chemical Formula VIII] in a solvent and causing them to react by adding a palladium catalyst:

[Chemical Formula I]

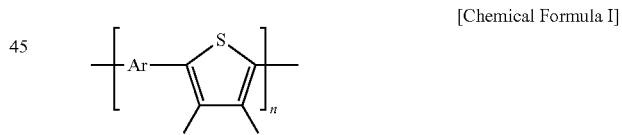

[Chemical Formula VII]

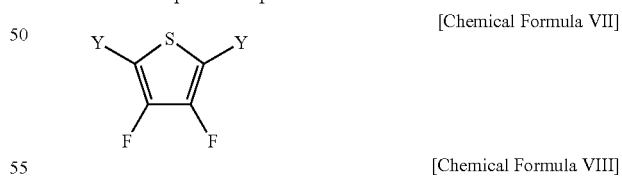

[Chemical Formula VIII]

In [Chemical Formula I], [Chemical Formula VII] and [Chemical Formula VIII], X is a halogen selected from Cl, Br and I, Y is selected from $R_6R_7R_8SnCl$ and $BO_2R_9R_{10}$, and n is an integer from 5 to 100,000.

Each of $R_6$, $R_7$ and $R_8$, which are identical or different, is hydrogen or a $C_1$-$C_8$ alkyl group, each of $R_9$, $R_{10}$, which are identical or different, is hydrogen or a $C_1$-$C_8$ alkyl group and the $R_9$ and the $R_{10}$ may be linked by a chemical bond.

Ar is the same as defined above in the description of the conductive organic semiconductor compound.

In another aspect, the present disclosure provides a method for preparing a conductive organic semiconductor compound represented by [Chemical Formula II], including dissolving a compound represented by [Chemical Formula VII] and a compound represented by [Chemical Formula IX] in a solvent and causing them to react by adding a palladium catalyst:

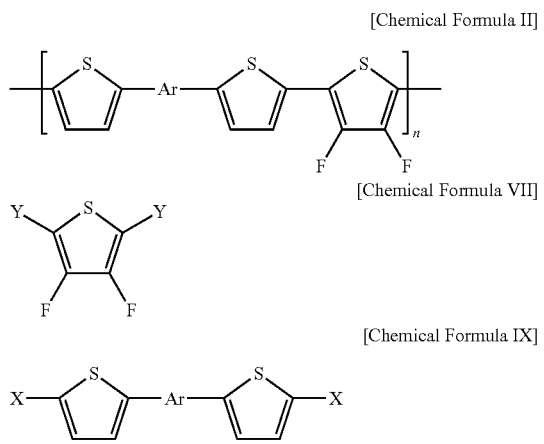

[Chemical Formula II]

[Chemical Formula VII]

[Chemical Formula IX]

In [Chemical Formula II], [Chemical Formula VII] and [Chemical Formula IX], X is a halogen selected from Cl, Br and I, Y is selected from $R_6R_7R_8SnCl$ and $BO_2R_9R_{10}$, and n is an integer from 5 to 100,000.

Each of $R_6$, $R_7$ and $R_8$, which are identical or different, is hydrogen or a $C_1$-$C_8$ alkyl group, each of $R_9$, $R_{10}$, which are identical or different, is hydrogen or a $C_1$-$C_8$ alkyl group and the $R_9$ and the $R_{10}$ may be linked by a chemical bond.

Ar is the same as defined above in the description of the conductive organic semiconductor compound.

A molar mixing ratio of the compound represented by [Chemical Formula VII] and the compound represented by [Chemical Formula VIII] or [Chemical Formula IX] may be 1:0.5-2.

The solvent may be one or more selected from a group consisting of toluene, dimethylformamide, methanol, hexane, tri(o-tolyl)phosphine, chlorobenzene, ethylene acetate, tetrahydrofuran and N-methylpyrrolidinone.

The preparation method may be conducted at 100-200° C. for 10-60 hours.

In another aspect, the present disclosure provides an organic semiconductor thin film including one or more of the conductive organic semiconductor compound described above.

The conductive organic semiconductor compound may be prepared into a thin film by a method selected from a group consisting of vacuum deposition, screen printing, printing, spin coating, dipping and inkjet printing.

In another aspect, the present disclosure provides an organic thin-film transistor, including a substrate, a gate electrode formed on the substrate, an insulating layer formed on the gate electrode, the organic semiconductor thin film formed on the insulating layer, and a source electrode layer and a drain electrode layer formed on the organic semiconductor thin film.

The organic thin-film transistor may have a top-contact or bottom-contact structure.

The gate electrode, the source electrode and the drain electrode may be selected from a group consisting of gold, silver, aluminum, nickel, chromium and indium tin oxide.

The substrate may be selected from a group consisting of glass, polyethylene naphthalate, polyethylene terephthalate, polycarbonate, polyvinyl alcohol, polyacrylate, polyimide, polynorbornene and polyethersulfone.

The insulating layer may be selected from a group consisting of a ferroelectric insulator selected from a group consisting of $Ba_{0.33}Sr_{0.66}TiO_3$ (BST), $Al_2O_3$, $Ta_2O_5$, $La_2O_5$, $Y_2O_3$ and $TiO_2$, an inorganic insulator selected from a group consisting of $PdZr_{0.33}Ti_{0.66}O_3$ (PZT), $Bi_4Ti_3O_{12}$, $BaMgF_4$, $SrBi_2(TaNb)_2O_9$, $Ba(ZrTi)O_3(BZT)$, $BaTiO_3$, $SrTiO_3$, $Bi_4Ti_3O_{12}$, $SiO_2$, $SiN_x$ and AlON, polyimide, BCB, parylene, polyacrylate, polyvinyl alcohol and polyvinylphenol.

Since the conductive organic semiconductor compound according to the present disclosure has superior charge mobility, low band gap, wide light absorption area and adequate molecular energy level, it can be used as a material for various organic optoelectric devices such as an organic photodiode (OPD), an organic light-emitting diode (OLED), an organic thin-film transistor (OTFT), an organic solar cell, etc. In addition, it can be prepared into a thin film via a solution process, can be advantageously used to fabricate large-area devices and can reduce the cost of device fabrication.

DETAILED DESCRIPTION OF EMBODIMENTS

Figure 1:
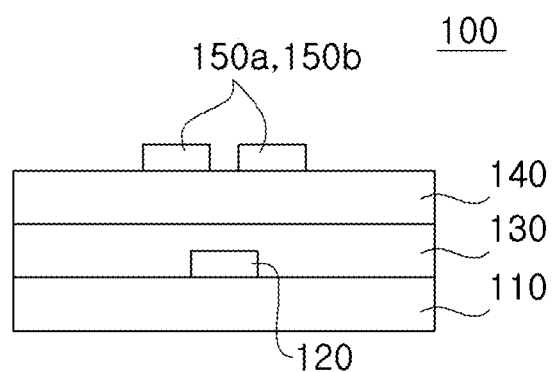
FIG. 1 is a cross-sectional view showing the structure of an organic thin-film transistor including a conductive organic semiconductor compound according to the present disclosure.

Hereinafter, various aspects and exemplary embodiments of the present disclosure are described in further detail.

In an aspect, the present disclosure provides a conductive organic semiconductor compound represented by [Chemical Formula I] or [Chemical Formula II]:

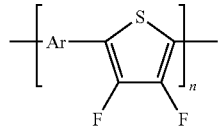

[Chemical Formula I]

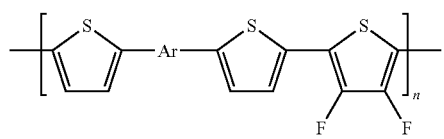

[Chemical Formula II]

In [Chemical Formula I] and [Chemical Formula II], Ar is selected from [Structural Formula 1]:

[Structural Formula 1]

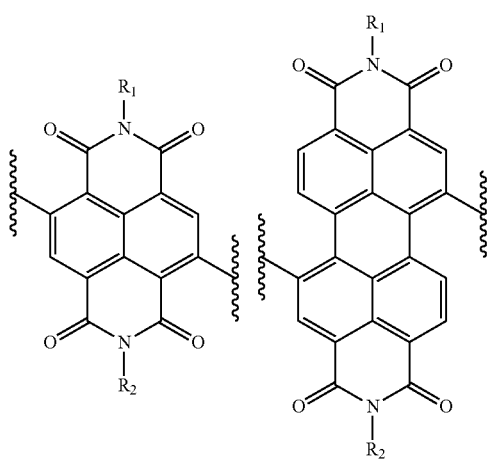

-continued

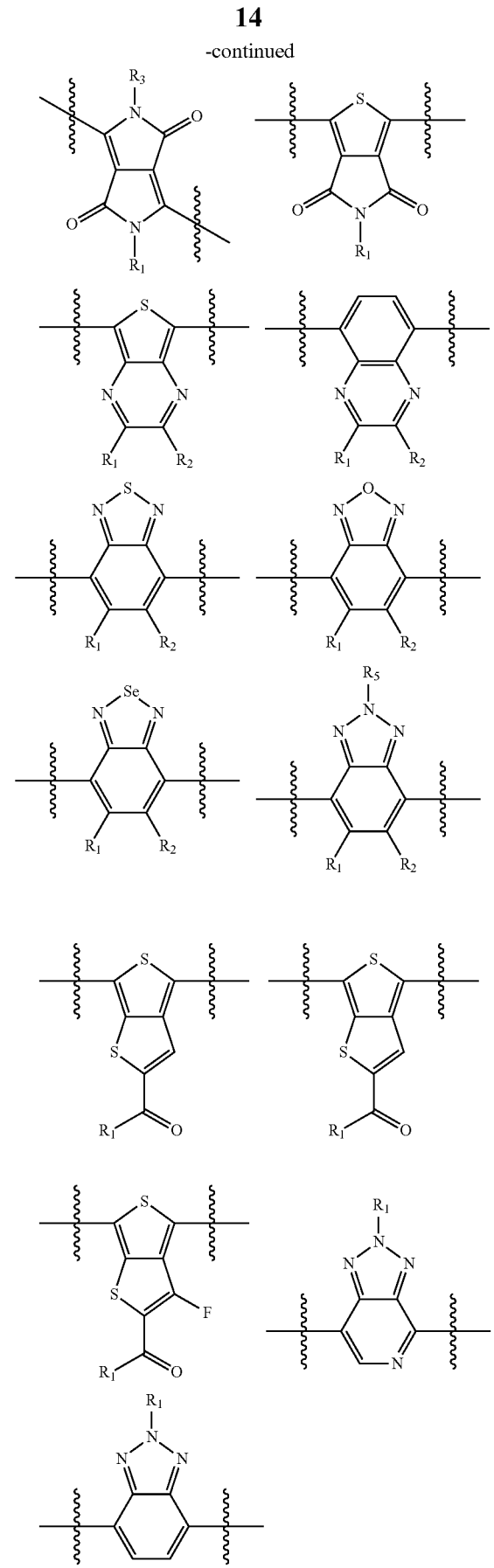

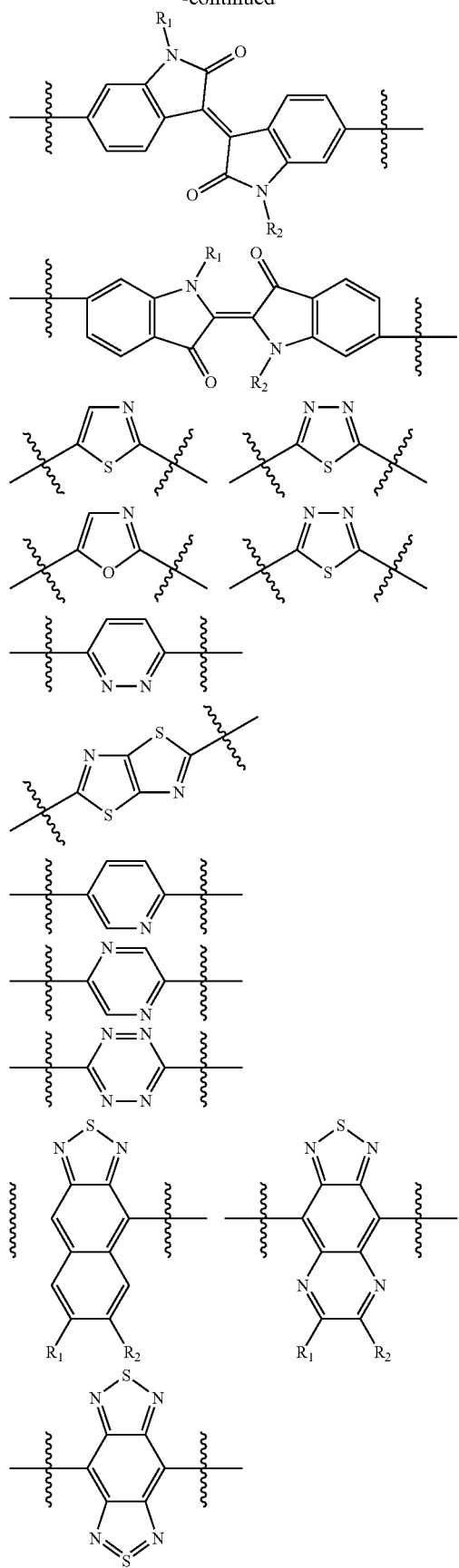
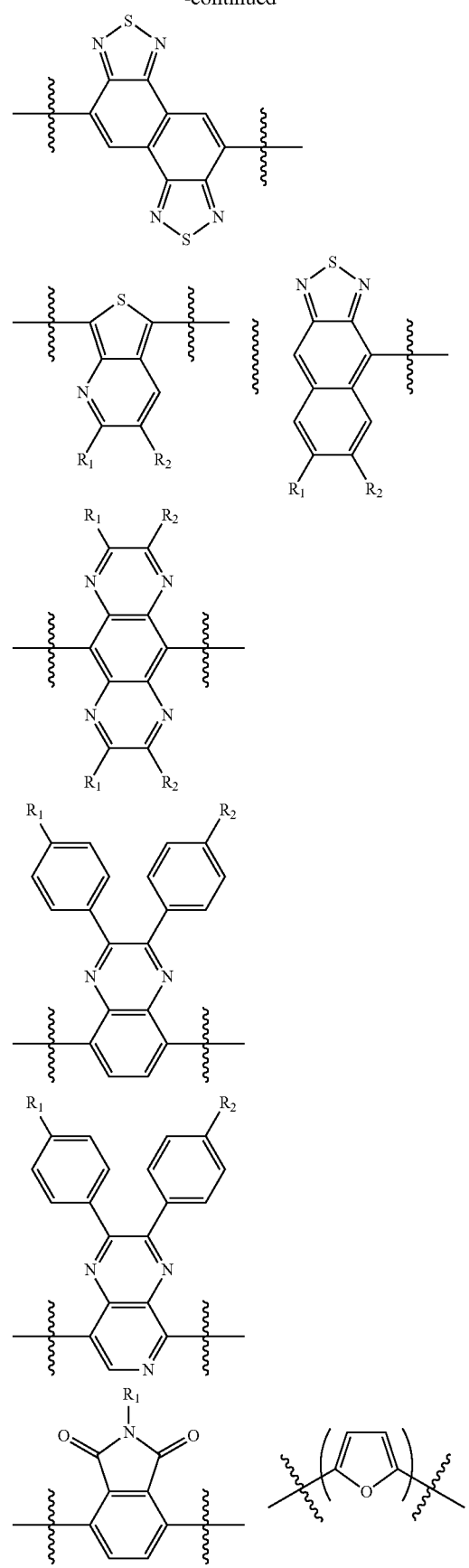

-continued

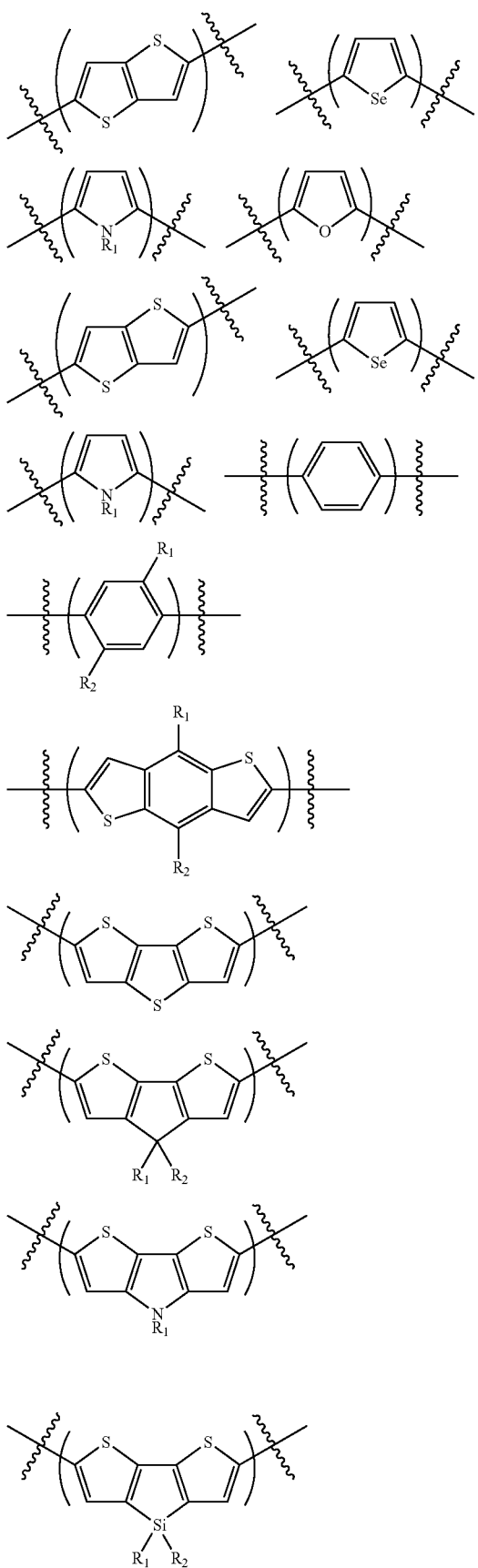

-continued

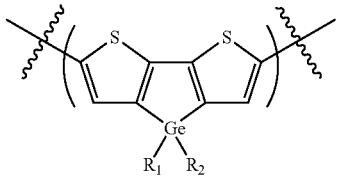

In [Structural Formula 1], each of $R_1$ and $R_2$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group, and n is an integer from 5 to 100,000.

The conductive organic semiconductor compound represented by [Chemical Formula II] may be represented by [Chemical Formula III] or [Chemical Formula IV]:

[Chemical Formula III]

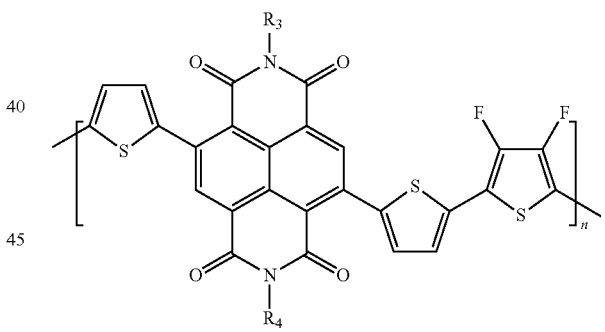

[Chemical Formula IV]

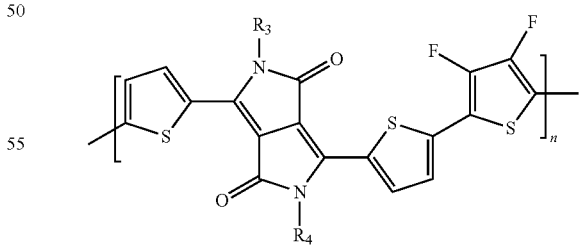

In [Chemical Formula III] and [Chemical Formula IV], each of $R_3$ and $R_4$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group, and n is an integer from 5 to 100,000.

The conductive organic semiconductor compound represented by [Chemical Formula III] may be represented by [Chemical Formula V]:

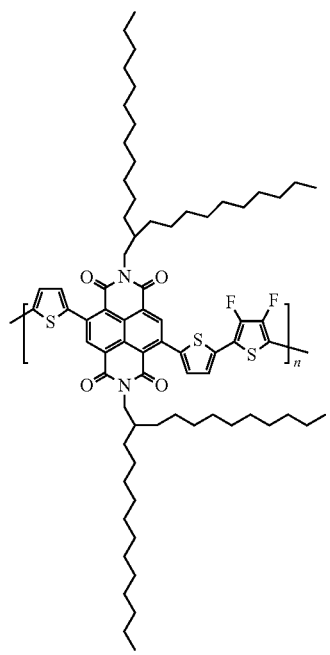

[Chemical Formula V]

In [Chemical Formula V], n is an integer from 5 to 100,000.

The conductive organic semiconductor compound represented by [Chemical Formula IV] may be represented by [Chemical Formula VI]:

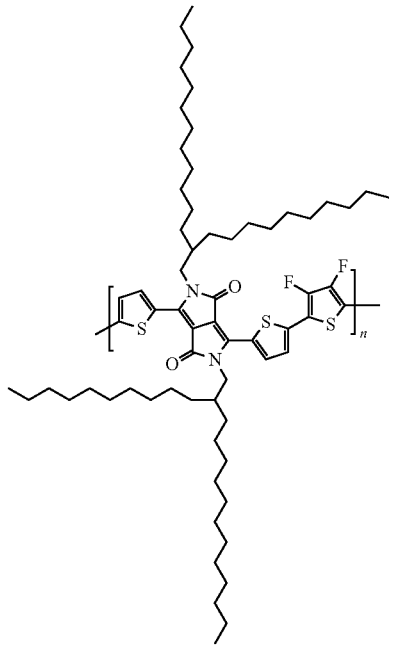

[Chemical Formula VI]

In [Chemical Formula VI], n is an integer from 5 to 100,000.

Since the conductive organic semiconductor compound has a number average molecular weight ($M_n$) of about 10,000-100,000, it can be controlled to have superior solubility for various organic solvents. Accordingly, it can be prepared into a thin film with superior crystallinity in various organic solvents.

In particular, since the conductive organic semiconductor compound has high a repeat unit having a thiophene monomer and a dipyrrolopyrrole monomer with high hole mobility and superior light absorption ability and a dithienobenzodithiophene core with excellent hole conductivity, it has low band gap and exhibits high charge mobility and low cutoff current loss when used as an organic semiconductor of a transistor.

The conductive organic semiconductor compound may have an electron mobility of $1 \times 10^{-6}$ cm²/V·s or higher.

Since the conductive organic semiconductor compound has a low band gap of 1.0-3.0 eV, it can be usefully used as a material for an organic optoelectric device selected from an organic photodiode, an organic light-emitting diode, an organic thin-film transistor and an organic solar cell.

The conductive organic semiconductor compound may be an n-type organic semiconductor compound.

In another aspect, the present disclosure provides a method for preparing a conductive organic semiconductor compound represented by [Chemical Formula I], including dissolving a compound represented by [Chemical Formula VII] and a compound represented by [Chemical Formula VIII] in a solvent and causing them to react by adding a palladium catalyst:

[Chemical Formula I]

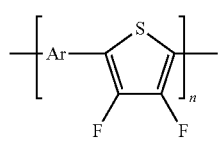

[Chemical Formula VII]

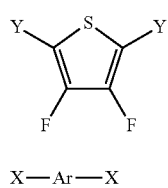

[Chemical Formula VIII]

X—Ar—X

In [Chemical Formula I], [Chemical Formula VII] and [Chemical Formula VIII], X is a halogen selected from Cl, Br and I, Y is selected from $R_6R_7R_8SnCl$ and $BO_2R_9R_{10}$, and n is an integer from 5 to 100,000.

Each of $R_6$, $R_7$ and $R_8$, which are identical or different, is hydrogen or a $C_1$-$C_8$ alkyl group, each of $R_9$, $R_{10}$, which are identical or different, is hydrogen or a $C_1$-$C_8$ alkyl group and the $R_9$ and the $R_{10}$ may be linked by a chemical bond.

Ar is selected from [Structural Formula 1]:

[Structural Formula 1]

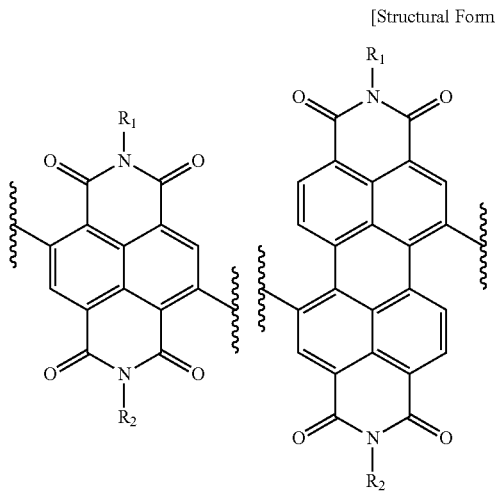

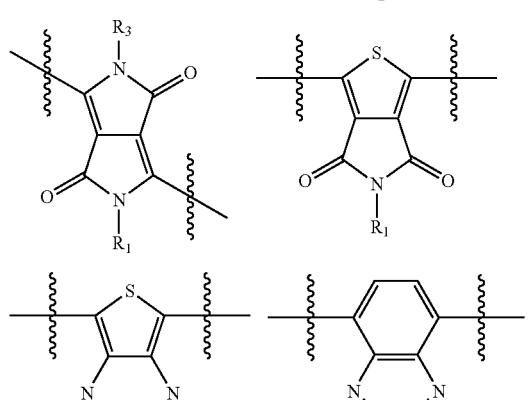

-continued

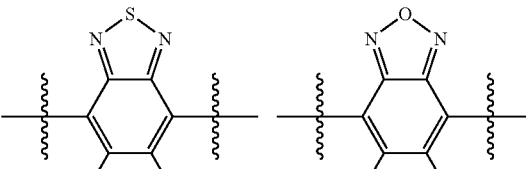

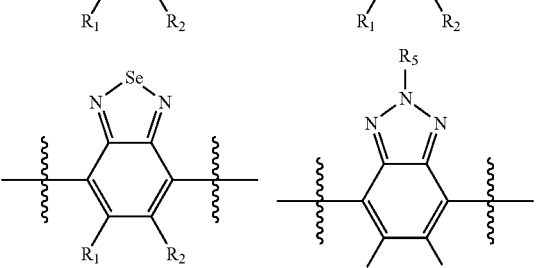

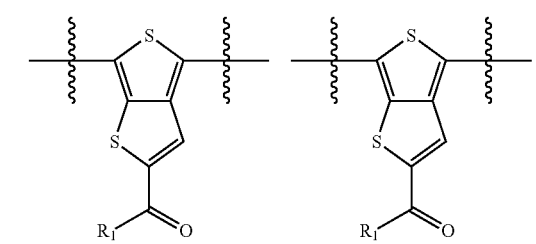

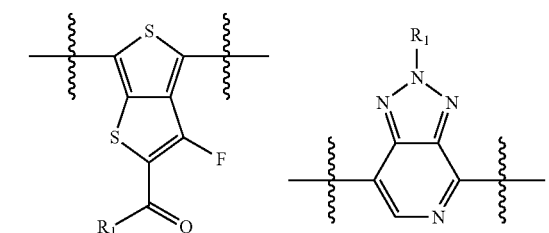

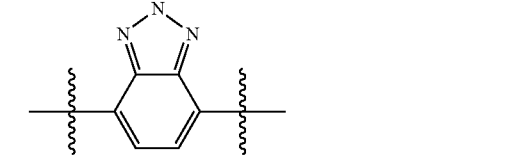

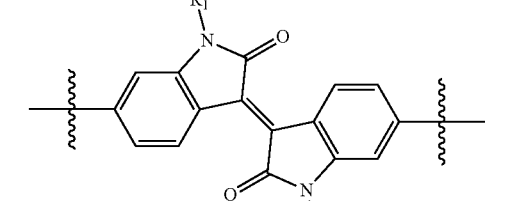

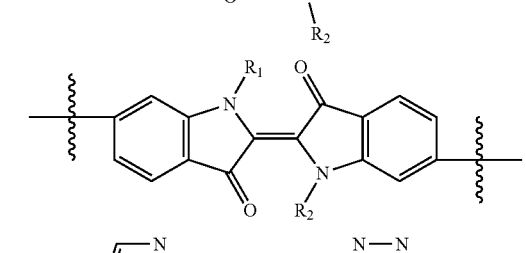

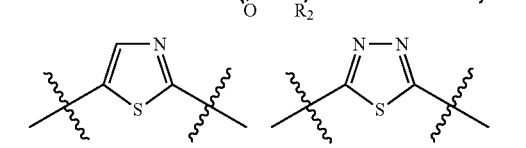

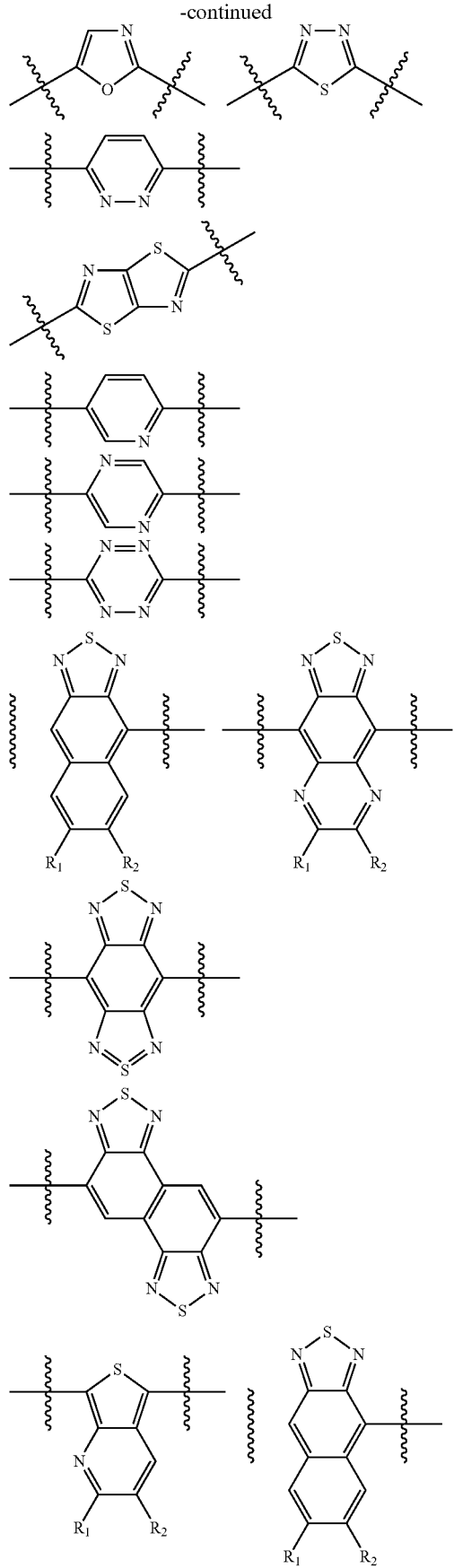
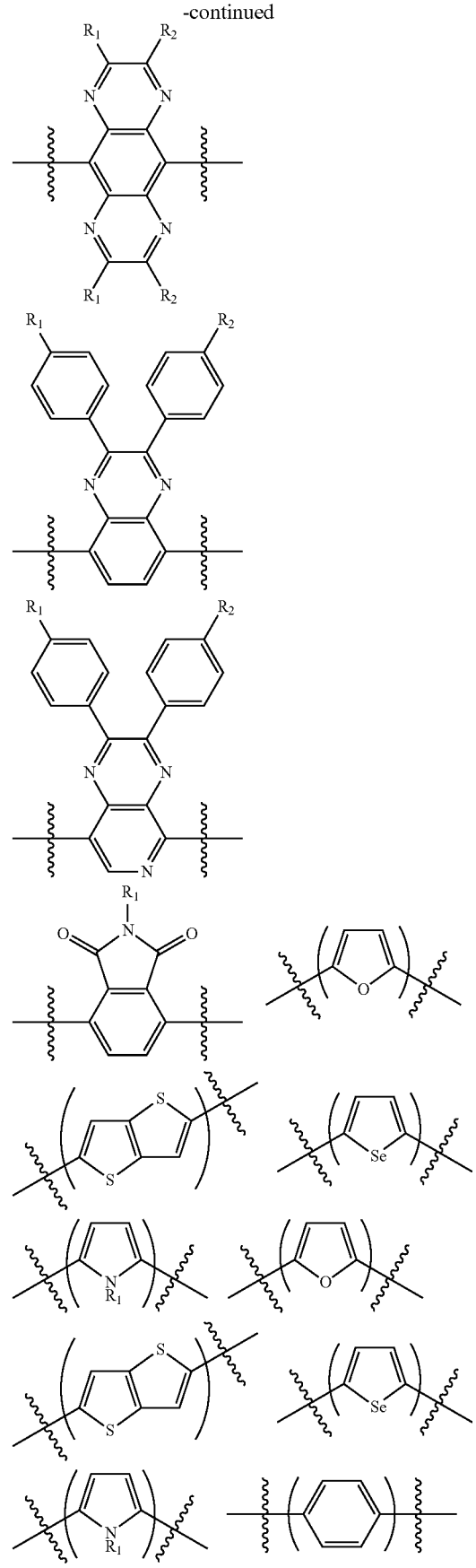

-continued

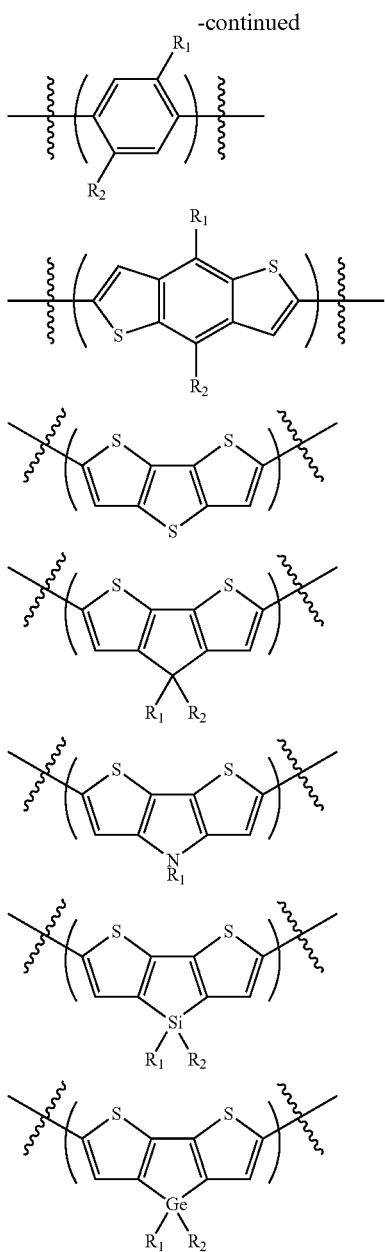

In [Structural Formula 1], each of $R_1$ and $R_2$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group, and n is an integer from 5 to 100,000.

In another aspect, the present disclosure provides a method for preparing a conductive organic semiconductor compound represented by [Chemical Formula II], including dissolving a compound represented by [Chemical Formula VII] and a compound represented by [Chemical Formula IX] in a solvent and causing them to react by adding a palladium catalyst:

[Chemical Formula II]

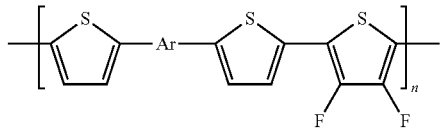

[Chemical Formula VII]

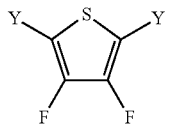

[Chemical Formula IX]

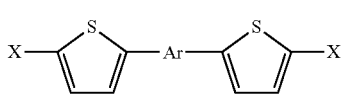

In [Chemical Formula II], [Chemical Formula VII] and [Chemical Formula IX], X is a halogen selected from Cl, Br and I, Y is selected from $R_6R_7R_8SnCl$ and $BO_2R_9R_{10}$, and n is an integer from 5 to 100,000.

Each of $R_6$, $R_7$ and $R_8$, which are identical or different, is hydrogen or a $C_1$-$C_8$ alkyl group, each of $R_9$, $R_{10}$, which are identical or different, is hydrogen or a $C_1$-$C_8$ alkyl group and the $R_9$ and the $R_{10}$ may be linked by a chemical bond.

Ar is the same as defined above in the description of the method for preparing a conductive organic semiconductor compound represented by [Chemical Formula I].

In the methods for preparing a conductive organic semiconductor compound represented by [Chemical Formula I] and a conductive organic semiconductor compound represented by [Chemical Formula II], the palladium catalyst may be a palladium(0) catalyst such as tetrakis(triphenylphosphine)palladium(0) (Pd(PPh$_3$)$_4$) or a palladium(II) catalyst such as 1,4-bis(triphenylphosphine)palladium(II) dichloride (PdCl$_2$(PPh$_3$)$_2$), [1,4-bis(diphenylphosphine)butane]palladium(II) dichloride (Pd(dppb)Cl$_2$), [1,1'-bis(diphenylphosphino)ferrocene]palladium(II) dichloride (Pd(dppf)Cl$_2$) or palladium(II) acetate (Pd(OAc)$_2$).

The content of the catalyst may be controlled depending on the monomers. For example, the tetrakis(triphenylphosphine)palladium compound may be used in an amount of 5-20 parts by weight based on 100 parts by weight of the monomer represented by [Chemical Formula VII].

In the preparation method, the solvent may be one or more selected from a group consisting of toluene, dimethylformamide, methanol, hexane, tri(o-tolyl)phosphine, chlorobenzene, ethylene acetate, tetrahydrofuran and N-methylpyrrolidinone.

The preparation method may be performed at 100-200° C. for 10-60 hours, more specifically at 100-140° C. for 20-40 hours.

The conductive organic semiconductor compound may be prepared into an organic semiconductor thin film. The organic semiconductor thin film may be prepared by a method selected from vacuum deposition, screen printing, printing, spin coating, dipping and inkjet printing.

Since the conductive organic semiconductor compound can be prepared into a thin film via a solution process, a large-area thin film can be prepared easily at low cost.

FIG. 1 is a cross-sectional view showing the structure of an organic thin-film transistor including a conductive organic semiconductor compound according to the present disclosure.

Referring to FIG. 1, the organic thin-film transistor 100 includes: a substrate 110; a gate electrode 120 formed on the substrate 110; an insulating layer 130 formed on the gate electrode 120; an organic semiconductor thin film 140 formed on the insulating layer 130; and a source electrode layer and a drain electrode layer 150a, 150b formed on the organic semiconductor thin film 140.

The substrate 110 may be formed of an inorganic material, an organic material or a composite of an inorganic material and an organic material. Specifically, it may be selected from a group consisting of glass, polyethylene naphthalate, polyethylene terephthalate, polycarbonate, polyvinyl alcohol, polyacrylate, polyimide, polynorbornene and polyethersulfone, although not being limited thereto.

The gate electrode 120 and the source electrode layer and the drain electrode layer 150a, 150b may be formed of a commonly used metal. Specifically, it may be selected from a group consisting of gold, silver, aluminum, nickel, chromium and indium tin oxide, although not being limited thereto.

The insulating layer 130 may be formed of a commonly used insulator with a high dielectric constant. Specifically, it may be selected from a group consisting of ferroelectric insulator selected from a group consisting of $Ba_{0.33}Sr_{0.66}TiO_3$ (BST), $Al_2O_3$, $Ta_2O_5$, $La_2O_5$, $Y_2O_3$ and $TiO_2$, an inorganic insulator selected from a group consisting of $PdZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$ and AlON, polyimide, BCB, parylene, polyacrylate, polyvinyl alcohol and polyvinylphenol, although not being limited thereto.

Specifically, the organic semiconductor thin film 140 may be an organic semiconductor thin film prepared from the conductive organic semiconductor compound represented by [Chemical Formula I] or the conductive organic semiconductor compound represented by [Chemical Formula II] described above. A description about the conductive organic semiconductor compounds will be omitted since it is the same as above.

Since the conductive organic semiconductor compound has excellent properties such as superior solubility and flexibility and low band gap, it can be used not only for the organic thin-film transistor but also for various memory devices, organic light-emitting diodes, photosensors, laser devices or photovoltaic devices such as an organic solar cell.

In particular, an organic solar cell prepared using the conductive organic semiconductor compound is advantageous in that the quantum yield is about 4 times or higher than that of the existing solar cell and the process cost is much lower.

Hereinafter, the present disclosure will be described in more detail through examples. However, the scope and content of the present disclosure cannot be interpreted as being reduced or limited by the examples. In addition, it will be obvious that various changes and modifications can be easily made by those of ordinary skill in the art based on the present disclosure including the examples and that those changes and modifications are included in the scope of the appended claims.

EXAMPLES

Synthesis Examples. Synthesis of Conductive Organic Semiconductor Compound According to the Present Disclosure

[Scheme 1]

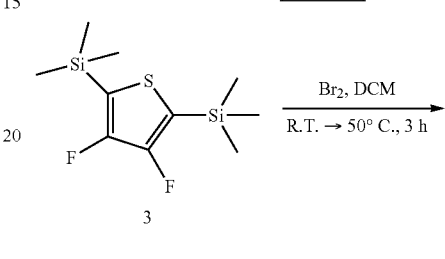

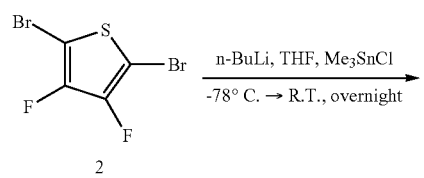

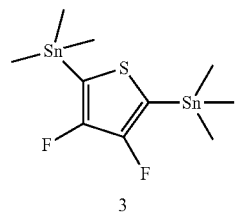

[Scheme 2]

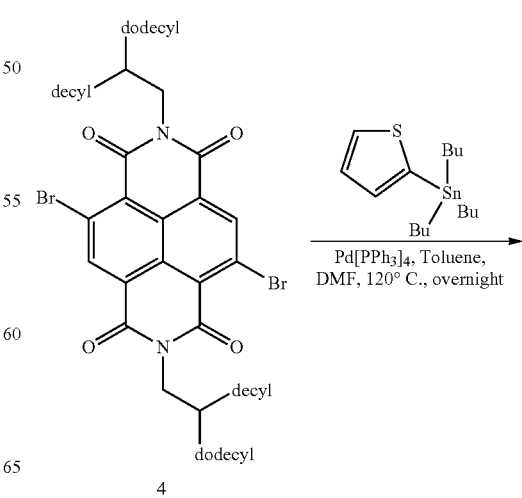

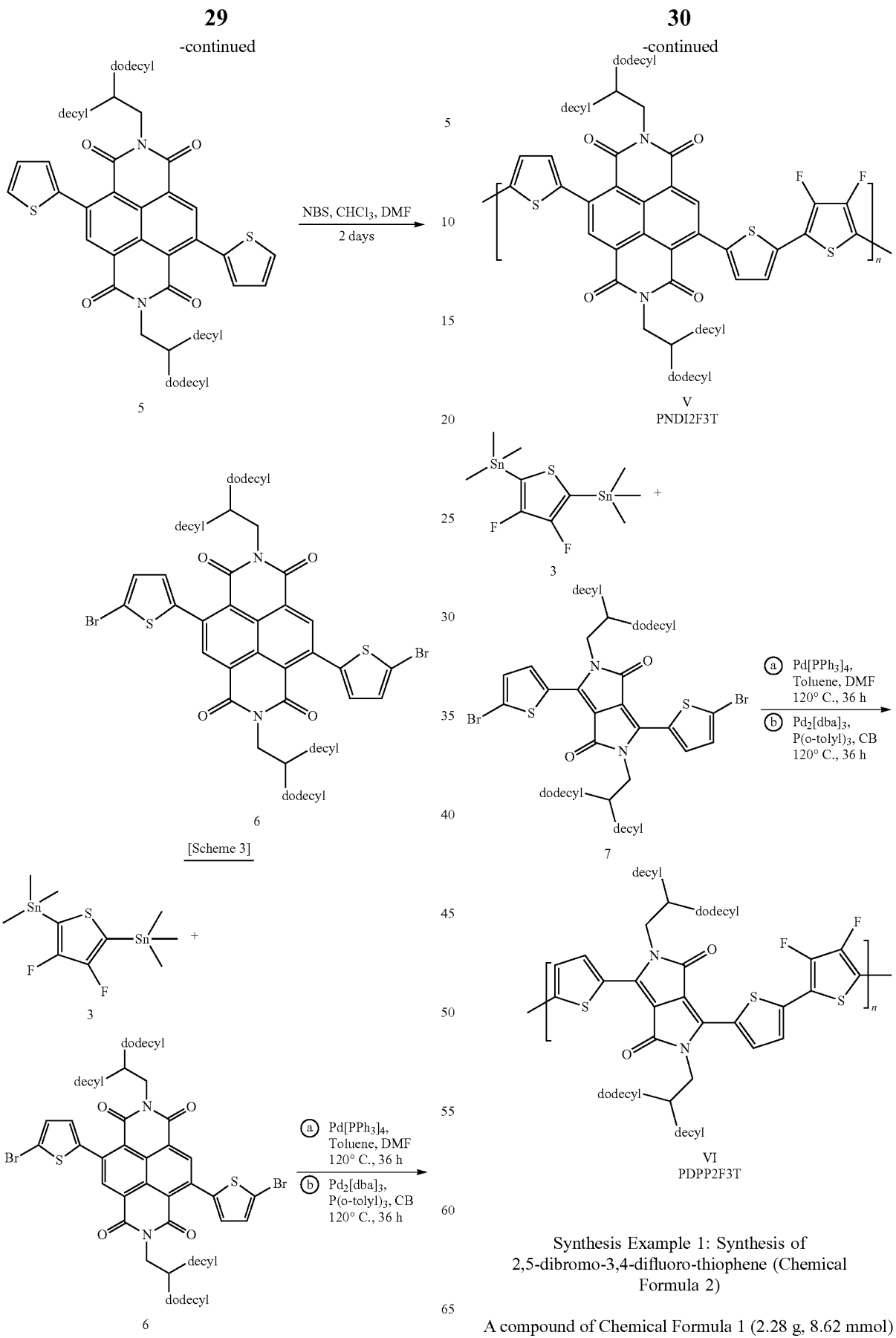
Synthesis Example 1: Synthesis of 2,5-dibromo-3,4-difluoro-thiophene (Chemical Formula 2)
A compound of Chemical Formula 1 (2.28 g, 8.62 mmol) and dichloromethane (10 mL) were added to a 100-mL flask containing a magnetic stirring bar. After cooling to 0° C., bromine (0.97 mL, 18.96 mmol) was slowly added dropwise. After slowly raising temperature to 50° C., reaction was performed for 3 hours. Then, after removing the remaining bromine with sodium bisulfite, followed by extraction with dichloromethane, the organic layer was dehydrated with magnesium sulfate. After removing the solvent using a rotary evaporator, followed by purification by column chromatography (hexane), 2,5-dibromo-3,4-difluoro-thiophene (Chemical Formula 2) (1.5 g, 62.6%) was obtained.

$^{13}$C NMR (100 MHz, CDCl$_3$): δ 90.33, 143.95.

Synthesis Example 2: Synthesis of 3,4-difluoro-2,5-bis-trimethylstannyl-thiophene (Chemical Formula 3)

The compound of Chemical Formula 2 (1.22 g, 4.39 mmol) and anhydrous tetrahydrofuran (18 mL) were added to a 100-mL flask containing a magnetic stirring bar under argon atmosphere. After cooling to −78° C., 1.6 M n-butyllithium (5.77 mL, 9.23 mmol) was slowly added dropwise. After maintaining at −78° C. for 40 minutes, followed by addition of a trimethyltin chloride solution (21.98 mL, 21.98 mmol, 1 M), reaction was performed for 12 hours at room temperature with stirring. After extracting with water and diethyl ether, the organic layer was dehydrated with magnesium sulfate. After removing the solvent using a rotary evaporator, followed by recrystallization in methanol at low temperature, 3,4-difluoro-2,5-bis-trimethylstannyl-thiophene (Chemical Formula 3) (786.2 mg, 40.1%) was obtained.

$^1$H NMR (400 MHz, CDCl$_3$): δ 0.39 (s, 12H).

Synthesis Example 3: Synthesis of N,N'-bis(2-decyltetradecyl)-2,6-di(thiophen-2-yl)naphthalene-1,4,5,8-bis(dicarboximide) (Chemical Formula 5)

The compound of Chemical Formula 4 (302.2 mg, 0.275 mmol), 2-tributylstannylthiophene (0.262 mL, 0.825 mmol) and tetrakis(triphenylphosphine)palladium(0) (Pd(PPh$_3$)$_4$) (15.9 mg, 0.014 mmol) were added to a 10-mL flask containing a magnetic stirring bar. Then, degassed toluene (4.8 mL) and dimethylformamide (1.2 mL) were added as solvents. After performing reaction at 120° C. for about 12 hours, the reaction mixture was cooled to room temperature, diluted with dichloromethane and washed 3 times with water and brine. The organic layer was dehydrated with magnesium sulfate and the solvent was removed using a rotary evaporator. After separation by column chromatography (dichloromethane:hexane=1:1), N,N'-bis(2-decyltetradecyl)-2,6-di(thiophen-2-yl)naphthalene-1,4,5,8-bis(dicarboximide) (Chemical Formula 5) (249.8 mg, 82.3%) was obtained.

$^1$H NMR (400 MHz, CDCl$_3$): δ 0.82-0.89 (m, 12H), 1.10-1.45 (m, 80H), 1.83-2.10 (br, 2H), 4.07 (d, 4H), 7.20 (d, 2H), 7.31 (d, 2H), 7.60 (d, 2H), 8.75 (s, 2H).

Synthesis Example 4: Synthesis of N,N'-bis(2-decyltetradecyl)-2,6-bis(5-bromothiophen-2-yl)naphthalene-1,4,5,8-bis(dicarboximide) (Chemical Formula 6)

The compound of Chemical Formula 5 (249.8 mg, 0.226 mmol), chloroform (8 mL) and dimethylformamide (2 mL) were added to a 25-mL flask containing a magnetic stirring bar. Then, a solution of N-bromosuccinimide (NBS) (96.7 mg, 0.543 mmol) dissolved in chloroform (2 mL) and dimethylformamide (3 mL) was slowly added dropwise. After covering with aluminum foil to prevent exposure to light and performing reaction at room temperature for 2 days, the solvent was removed using a rotary evaporator. After separation by column chromatography (dichloromethane:hexane=1:2), N,N'-bis(2-decyltetradecyl)-2,6-bis(5-bromothiophen-2-yl)naphthalene-1,4,5,8-bis(dicarboximide) (Chemical Formula 6) (205 mg, 71.9%) was obtained.

$^1$H NMR (400 MHz, CDCl$_3$): δ 0.79-0.92 (m, 12H), 1.10-1.43 (m, 80H), 1.83-2.01 (m, 2H), 4.06 (d, 4H), 7.08 (d, 2H), 7.14 (d, 2H), 8.71 (s, 2H).

Synthesis Example 5: Synthesis of PNDI2F3T (Chemical Formula V) (Synthesis Method 1)

The 3,4-difluoro-2,5-bis-trimethylstannyl-thiophene (Chemical Formula 3) (35.7 mg, 0.08 mmol) obtained in Synthesis Example 2, the N,N'-bis(2-decyltetradecyl)-2,6-bis(5-bromothiophen-2-yl)naphthalene-1,4,5,8-bis(dicarboximide) (Chemical Formula 6) (101 mg, 0.08 mmol) obtained in Synthesis Example 4 and tetrakis(triphenylphosphine)palladium(0) (Pd(PPh$_3$)$_4$) (3.9 mg, 3.44 μmol) were added to a 5-mL flask containing a magnetic stirring bar. Then, degassed toluene (1.3 mL) and dimethylformamide (0.3 mL) were added as solvents. After performing reaction at 120° C. for about 36 hours, the reaction mixture was cooled to room temperature, reprecipitated in methanol (50 mL) and then filtered. The reaction mixture was Soxhlet extracted with hexane and methanol and then with chloroform. The extracted solution was passed through a celite filter and the solvent was removed using a rotary evaporator. After reprecipitation in methanol (50 mL), a polymer PNDI2F3T (Chemical Formula V) (62 mg, 63.5%) was obtained.

GPC: M$_n$=13.5 kg/mol; PDI=1.53.

Synthesis Example 6: Synthesis of PNDI2F3T (Chemical Formula V) (Synthesis Method 2)

The 3,4-difluoro-2,5-bis-trimethylstannyl-thiophene (Chemical Formula 3) (35.5 mg, 0.08 mmol) obtained in Synthesis Example 2, the N,N'-bis(2-decyltetradecyl)-2,6-bis(5-bromothiophen-2-yl)naphthalene-1,4,5,8-bis(dicarboximide) (Chemical Formula 6) (100.4 mg, 0.08 mmol) obtained in Synthesis Example 4, tris(dibenzylideneacetone)dipalladium(0) (Pd$_2$[dba]$_3$) (1.5 mg, 1.6 μmol) and tri(o-tolyl)phosphine (1.9 mg, 6.4 μmol) were added to a 5-mL flask containing a magnetic stirring bar. Then, degassed chlorobenzene (1.6 mL) was added as a solvent. After performing reaction at 120° C. for about 36 hours, the reaction mixture was cooled to room temperature, reprecipitated in methanol (50 mL) and then filtered. The reaction mixture was Soxhlet extracted with hexane and methanol and then with chloroform. The extracted solution was passed through a celite filter and the solvent was removed using a rotary evaporator. After reprecipitation in methanol (50 mL), a polymer PNDI2F3T (Chemical Formula V) (82.5 mg, 85.0%) was obtained.

GPC: M$_n$=24.7 kg/mol; PDI=1.83.

Synthesis Example 7: Synthesis of PDPP2F3T (Chemical Formula VI) (Synthesis Method 1)

The 3,4-difluoro-2,5-bis-trimethylstannyl-thiophene (Chemical Formula 3) (53.6 mg, 0.12 mmol) obtained in Synthesis Example 2, 3,6-bis(5-bromothiophen-2-yl)-2,5-bis(2-decyltetradecyl)pyrrolo[3,4-c]pyrrole-1,4(2H,5H)-dione (Chemical Formula 7) (136.1 mg, 0.12 mmol) and tetrakis(triphenylphosphine)palladium(0) (Pd(PPh$_3$)$_4$) (6.0 mg, 5.17 μmol) were added to a 5-mL flask containing a magnetic stirring bar. Then, degassed toluene (1.9 mL) and dimethylformamide (0.5 mL) were added as solvents. After performing reaction at 120° C. for about 36 hours, the reaction mixture was cooled to room temperature, reprecipitated in methanol (50 mL) and then filtered. The reaction mixture was Soxhlet extracted with methanol, acetone and ethylene acetate and then with chloroform. The extracted solution was passed through a celite filter and the solvent was removed using a rotary evaporator. After reprecipitation in methanol (50 mL), a polymer PDPP2F3T (Chemical Formula VI) (90 mg, 68.8%) was obtained.

GPC: M$_n$=26.8 kg/mol; PDI=2.98.

Synthesis Example 8: Synthesis of PDPP2F3T (Chemical Formula VI) (Synthesis Method 2)

The 3,4-difluoro-2,5-bis-trimethylstannyl-thiophene (Chemical Formula 3) (50.8 mg, 0.114 mmol) obtained in Synthesis Example 2, 3,6-bis(5-bromothiophen-2-yl)-2,5-bis(2-decyltetradecyl)pyrrolo[3,4-c]pyrrole-1,4(2H,5H)-dione (Chemical Formula 7) (129.0 mg, 0.114 mmol), tris(dibenzylideneacetone)dipalladium(0) (Pd$_2$[dba]$_3$) (2.1 mg, 2.3 μmol) and tri(o-tolyl)phosphine (2.8 mg, 9.1 μmol) were added to a 5-mL flask containing a magnetic stirring bar. Then, degassed chlorobenzene (2.3 mL) was added as a solvent. After performing reaction at 120° C. for about 36 hours, the reaction mixture was cooled to room temperature, reprecipitated in methanol (50 mL) and then filtered. The reaction mixture was Soxhlet extracted with methanol and ethylene acetate and then with chloroform. The extracted solution was passed through a celite filter and the solvent was removed using a rotary evaporator. After reprecipitation in methanol (50 mL), a polymer PDPP2F3T (Chemical Formula VI) (108.9 mg, 87.7%) was obtained.

GPC: M$_n$=39.8 kg/mol; PDI=2.76.

Example 1. Preparation of Organic Semiconductor Thin Film

A glass substrate was prepared by drying after washing in isopropyl alcohol for 10 minutes, in acetone for 10 minutes and then in isopropyl alcohol for 10 minutes.

Then, a solution obtained by dissolving the conductive organic semiconductor compound (10 mg) prepared in Synthesis Example 5, 6, 7 or 8 in 1 mL of chlorobenzene was spin coated on the glass substrate at 1000 rpm to obtain each organic semiconductor thin film. Subsequently, the thin film was annealed at 200° C.

Example 2. Analysis of Electrical Properties of Conductive Organic Semiconductor Material The electrochemical properties of the organic semiconductor thin film prepared in Example 1 was analyzed by cyclic voltammetry and its energy level was calculated.

Cyclic voltammetry measurement was made as follows. First, the organic semiconductor thin film (Example 1) coated on a carbon glass electrode was prepared as a working electrode, a platinum wire was prepared as a counter electrode and Ag/Ag$^+$ was prepared as a reference electrode. A voltage was applied to the reference electrode (Ag/Ag$^+$) using a potentiometer and the current flowing as a result of redox reaction of the analyte below the working electrode was measured at the counter electrode. The measured current was corrected for redox potential measurement using ferrocene/ferrocenium (Fc/Fc$^+$) under the same condition. The redox potential of ferrocene/ferrocenium (Fc/Fc$^+$) was 0.09 eV higher than that of the Ag/Ag$^+$ electrode. The voltage when oxidation started ((pox) and the voltage ($\varphi_{red}$) when reduction started were measured and the highest occupied molecular orbital (HOMO) energy level and the lowest unoccupied molecular orbital (LUMO) energy level were calculated according to Equation 1.

$$E_{HOMO} = -4.8(\Phi_{OX} - 0.09) \text{ (eV)}$$

$$E_{LUMO} = -4.8(\Phi_{red} - 0.09) \text{ (eV)} \quad \text{Equation 1}$$

Example 3. Fabrication of Organic Thin-Film Transistor Using Conductive Organic Semiconductor Material A transistor having a top-contact structure was fabricated using the conductive organic semiconductor compounds synthesized in Synthesis Examples 6 and 8 (PNDI2F3T, PDPP2F3T). The structure is shown in detail in FIG. 1.

To fabricate the transistor, first, a 300-nm thick silicon oxide film was formed on a heavily p-doped silicon gate electrode as insulating layer. Subsequently, a 20-nm thick Cytop™ thin film was formed on the insulating layer by spin coating and then a zirconium oxide film was formed by spin coating a solution of zirconium(IV) acetylacetonate (Zr (acac)$_4$) dissolved in DMF via a sol-gel process. After annealing at 200° C. for an hour, a 40-nm thick polymer thin film was formed by spin coating a 0.2 wt % solution of the polymer dissolved in chloroform. Then, gold or aluminum was deposited to a thickness of 60 nm to form source and drain electrodes.

Figure 2:
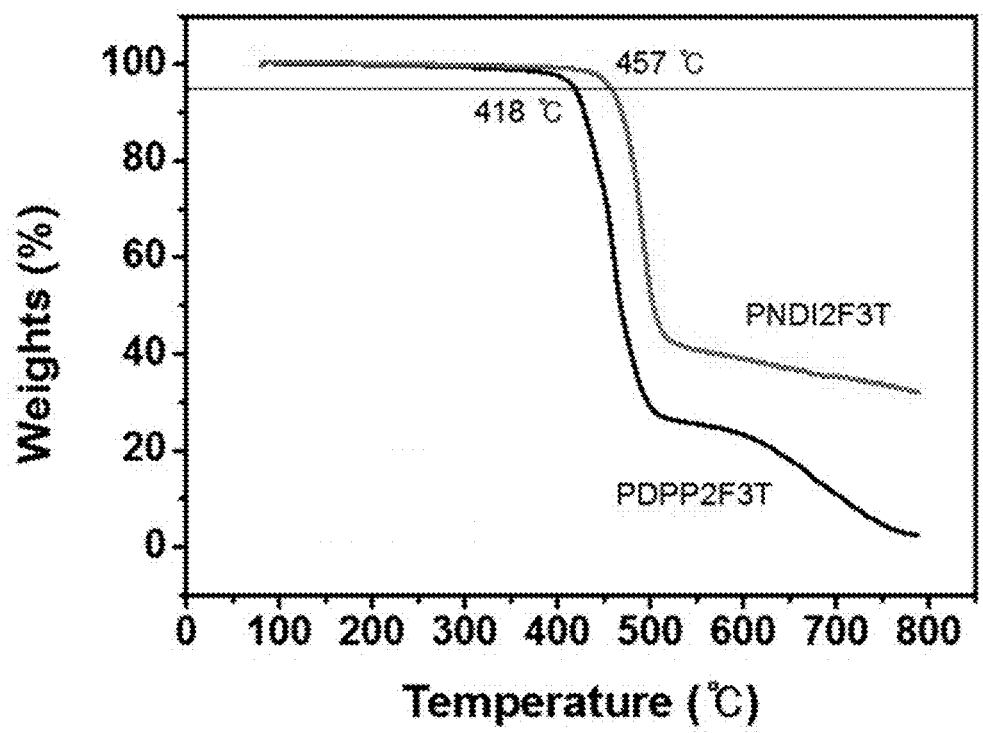
FIG. 2 shows the thermogravimetric analysis (TGA) result of a conductive organic semiconductor compound prepared in Synthesis Example 6 (PNDI2F3T) and a conductive organic semiconductor compound prepared in Synthesis Example 8 (PDPP2F3T).

Test Example 1. Thermal Properties of Conductive Organic Semiconductor Compound FIG. 2 shows the thermogravimetric analysis (TGA) result of the conductive organic semiconductor compound prepared in Synthesis Example 6 (PNDI2F3T) and the conductive organic semiconductor compound prepared in Synthesis Example 8 (PDPP2F3T). And, FIG. 3 shows the differential scanning calorimetry (DSC) result of the conductive organic semiconductor compound prepared in Synthesis Example 6 (PNDI2F3T) and the conductive organic semiconductor compound prepared in Synthesis Example 8 (PDPP2F3T).

Figure 3:
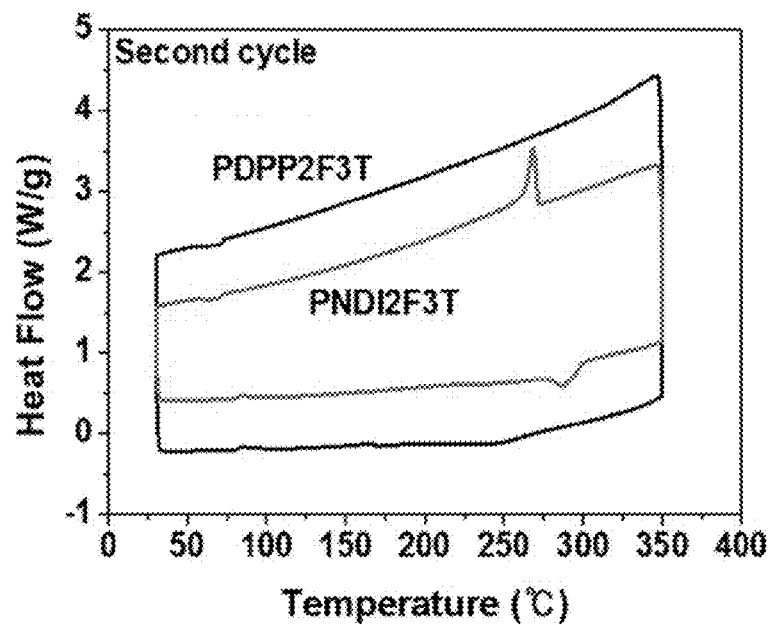
FIG. 3 shows the differential scanning calorimetry (DSC) result of a conductive organic semiconductor compound prepared in Synthesis Example 6 (PNDI2F3T) and a conductive organic semiconductor compound prepared in Synthesis Example 8 (PDPP2F3T).

As seen from FIG. 2 and FIG. 3, the conductive organic semiconductor compounds according to the present disclosure have superior thermal stability with high glass transition temperatures (T$_g$) above 400° C. (initial decomposition temperatures: 418° C. and 457° C., respectively). Accordingly, they can exhibit long life time when used as materials for an organic optoelectric device and can exhibit superior process stability when thermal deposition is necessary.

Figure 4:
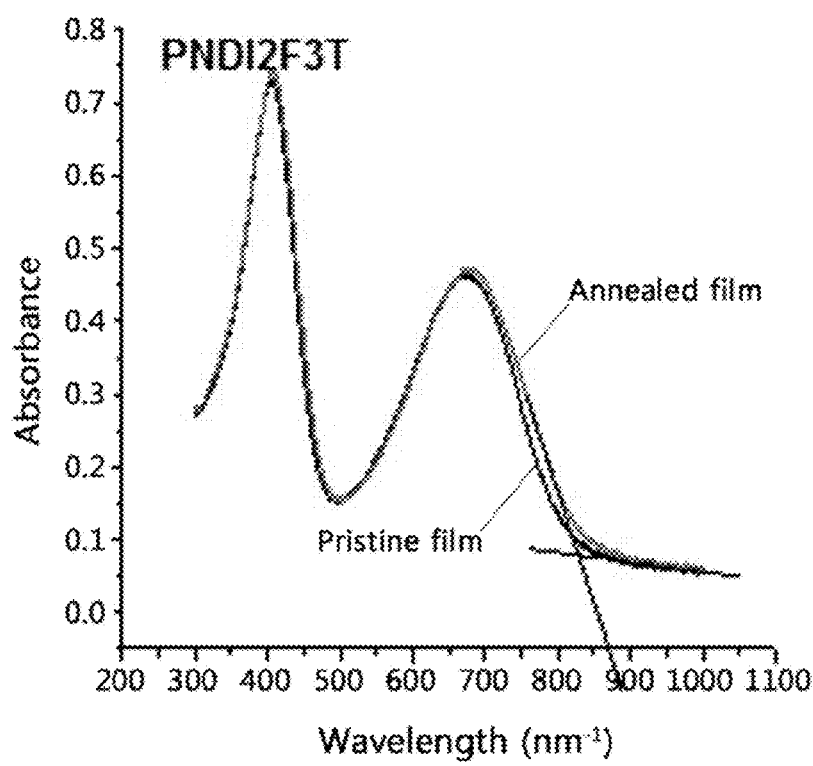
FIG. 4 shows the UV-vis absorption spectra of an organic semiconductor thin film prepared in Example 2 using a conductive organic semiconductor compound (PNDI2F3T, Synthesis Example 6) before and after annealing.
Figure 5:
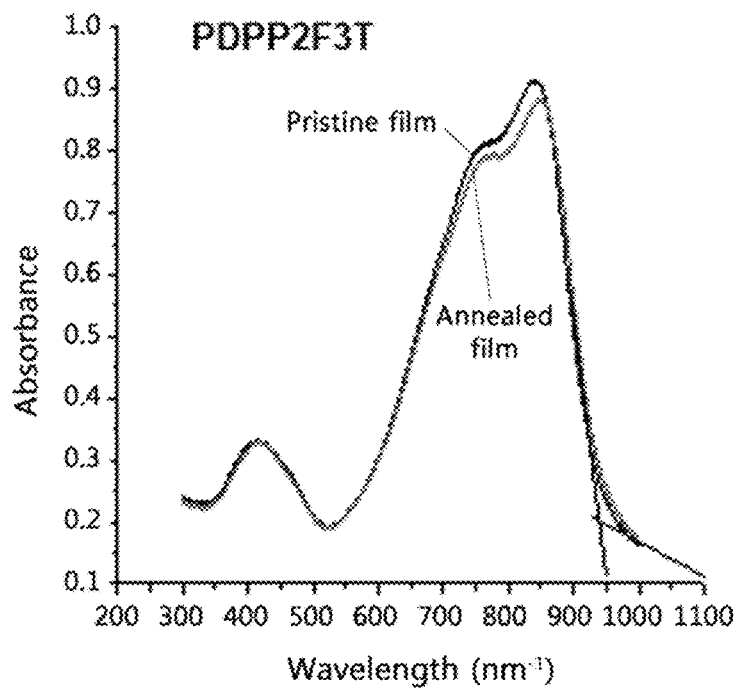
FIG. 5 shows the UV-vis absorption spectra of an organic semiconductor thin film prepared in Example 2 using a conductive organic semiconductor compound (PDPP2F3T, Synthesis Example 8) before and after annealing.
Figure 6:
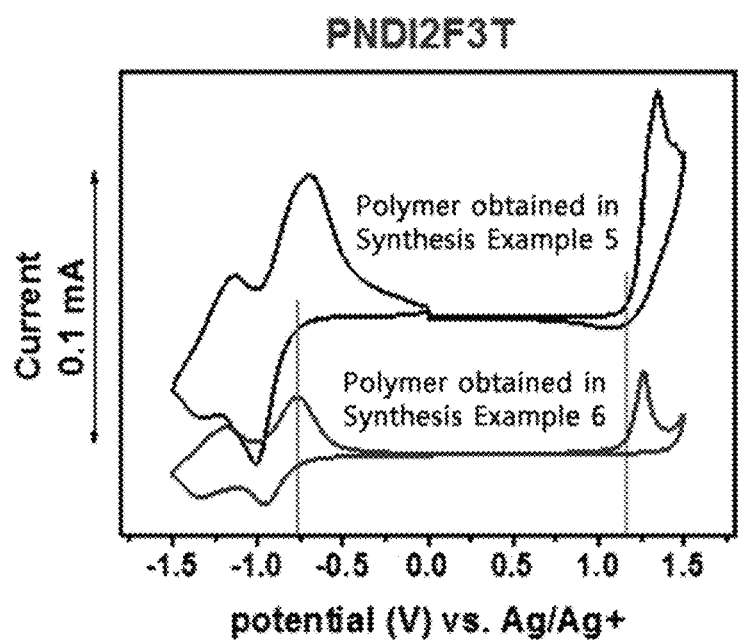
FIG. 6 shows the electrochemical properties of an organic semiconductor thin film prepared in Example 1 using a conductive organic semiconductor compound (PNDI2F3T, Synthesis Example 5 or 6) measured by cyclic voltammetry.
Figure 7:
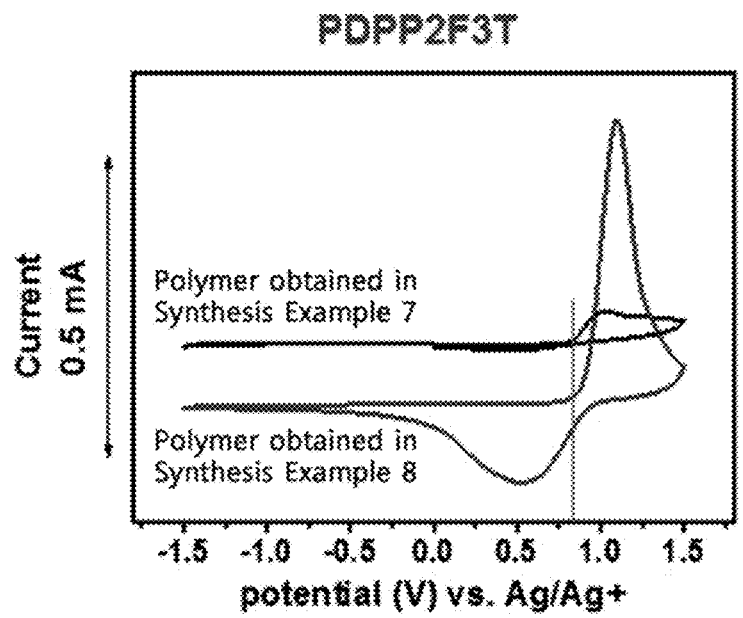
FIG. 7 shows the electrochemical properties of an organic semiconductor thin film prepared in Example 1 using a conductive organic semiconductor compound (PDPP2F3T, Synthesis Example 7 or 8) measured by cyclic voltammetry.

Test Example 2. Optical Properties of Conductive Organic Semiconductor Compound FIG. 4 shows the UV-vis absorption spectra of the organic semiconductor thin film prepared in Example 2 using the conductive organic semiconductor compound (PNDI2F3T, Synthesis Example 6) before and after annealing. And, FIG. 5 shows the UV-vis absorption spectra of the organic semiconductor thin film prepared in Example 2 using the conductive organic semiconductor compound (PDPP2F3T, Synthesis Example 8) before and after annealing. In FIG. 4 and FIG. 5, the organic semiconductor thin film before the annealing was denoted as pristine film and the organic semiconductor thin film after the annealing was denoted as annealed film.

The maximum absorption wavelength ($\lambda_{max}$), onset absorption wavelength ($\lambda_{onset}$) and optical band gap ($E_{g,opt}$) of the organic semiconductor thin film prepared in Example 2 using the conductive organic semiconductor compound (PNDI2F3T, Synthesis Example 6; PDPP2F3T, Synthesis Example 8) measured after the annealing are described in [Table 1].

TABLE 1

| | Maximum absorption wavelength ($\lambda_{max}$) | Onset absorption wavelength ($\lambda_{onset}$) | Optical band gap ($E_{g,opt}$) |
|---|---|---|---|
| PNDI2F3T (Synthesis Example 6) | 407, 680 nm | 829 nm | 1.50 eV |
| PDPP2F3T (Synthesis Example 8) | 850 nm | 940 nm | 1.32 eV |

As seen from FIG. 4, FIG. 5 and Table 1, the organic semiconductor thin films prepared from the conductive organic semiconductor compounds according to the present disclosure had low band gaps required for organic solar cells. This suggests that the conductive organic semiconductor compound of the present disclosure can be used to prepare a high-efficiency organic solar cell.

Test Example 3. Characteristics of Organic Thin-Film Transistor

After measuring the drain voltage-drain current vs. gate voltage and the gate voltage-drain current vs. drain voltage using the Keithley 2400 source/measure units, the characteristics of the fabricated device in the saturation regime were evaluated according to the following equation.

$$I_{ds} = \frac{WC_i}{2L}\mu(V_{gs} - V_T)^2 \quad \text{Equation 2}$$

In Equation 2, VT is the threshold voltage, $V_{gs}$ is the applied gate voltage, $\mu$ is the field-effect charge mobility, W and L are the channel width and length, and C is the capacitance of the insulating layer. The threshold voltage is determined by the gate voltage when $I_{ds}$ is 0 from the graph of $\sqrt{I_{ds}}$ vs. $V_{gs}$, and the field-effect charge mobility is calculated from the slope of the $\sqrt{I_{ds}}$ vs. $V_{gs}$ curve.

Figure 8:
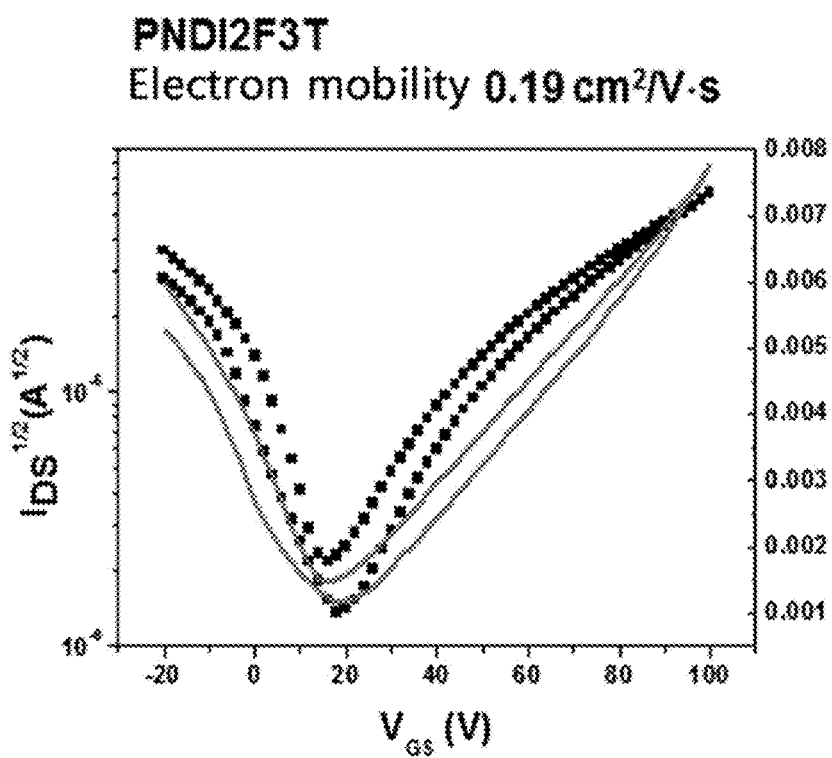
FIG. 8 shows the current-voltage (J-V) curve showing the electron mobility of an organic thin-film transistor prepared in Example 3 using a conductive organic semiconductor compound (PNDI2F3T, Synthesis Example 6). Gold was used as a top electrode of the organic thin-film transistor.
Figure 9:
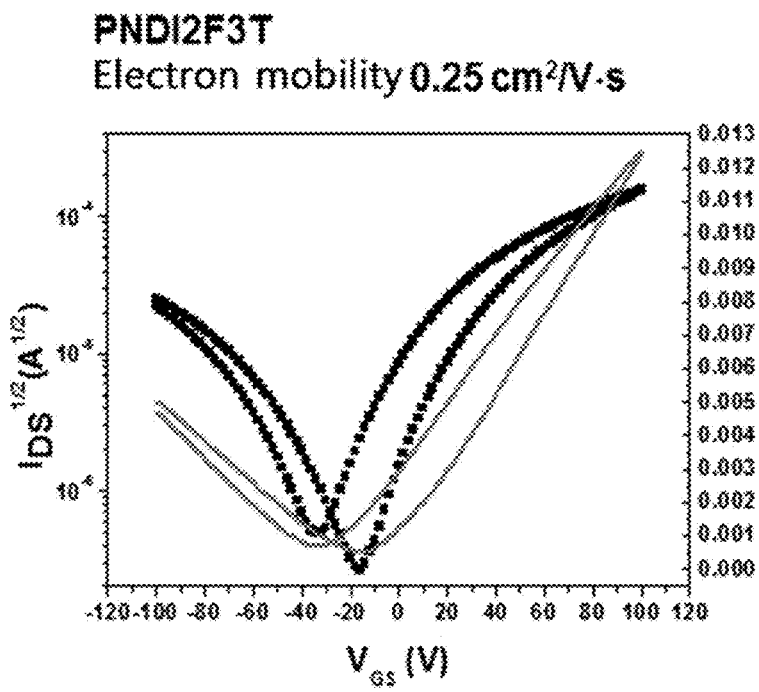
FIG. 9 shows the current-voltage (J-V) curve showing the electron mobility of an organic thin-film transistor prepared in Example 3 using a conductive organic semiconductor compound (PNDI2F3T, Synthesis Example 6). Aluminum was used as a top electrode of the organic thin-film transistor.

FIGS. 8 and 9 show the current-voltage (J-V) curves showing the electron mobility of the organic thin-film transistors prepared in Example 3 using the conductive organic semiconductor compound (PNDI2F3T, Synthesis Example 6). Gold or aluminum was used as the top electrode of the organic thin-film transistors, respectively.

Figure 10:
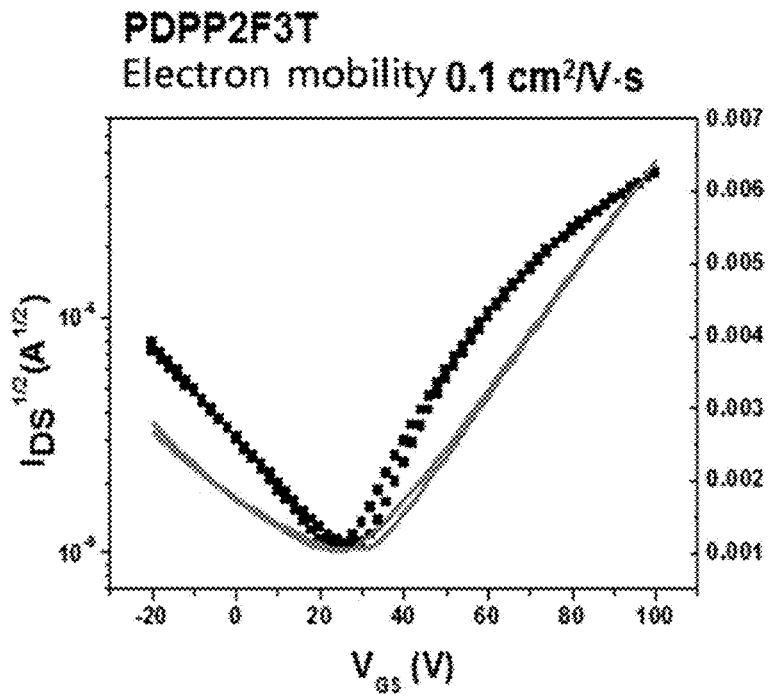
FIG. 10 shows the current-voltage (J-V) curve showing the electron mobility of an organic thin-film transistor prepared in Example 3 using a conductive organic semiconductor compound (PDPP2F3T, Synthesis Example 8). Gold was used as a top electrode of the organic thin-film transistor.
Figure 11:
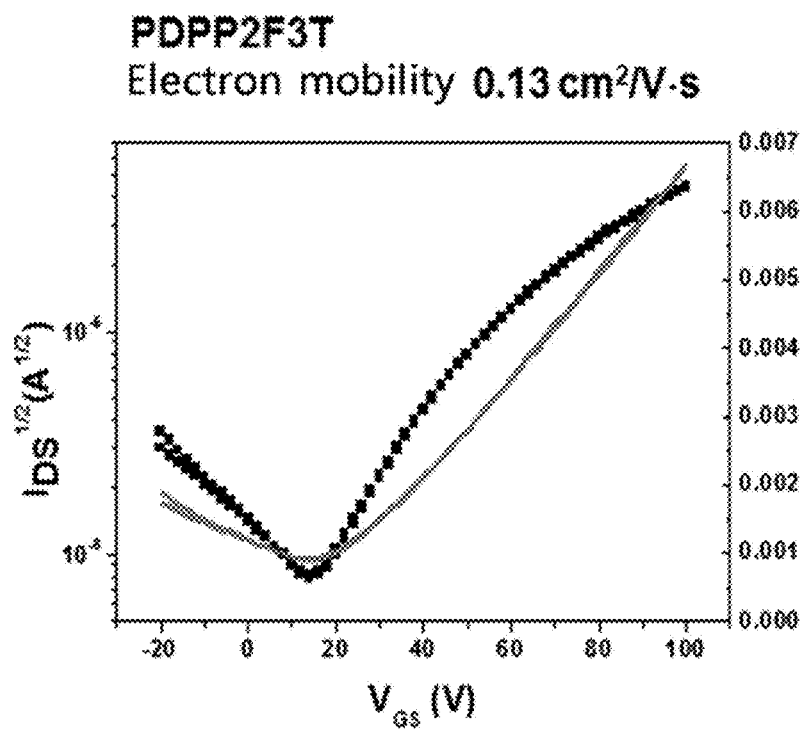
FIG. 11 shows the current-voltage (J-V) curve showing the electron mobility of an organic thin-film transistor prepared in Example 3 using a conductive organic semiconductor compound (PDPP2F3T, Synthesis Example 8). Aluminum was used as a top electrode of the organic thin-film transistor.

FIGS. 10 and 11 show the current-voltage (J-V) curves showing the electron mobility of the organic thin-film transistors prepared in Example 3 using the conductive organic semiconductor compound (PDPP2F3T, Synthesis Example 8). Gold or aluminum was used as the top electrode of the organic thin-film transistors, respectively.

The performance of the organic thin-film transistors is described in more detail in Table 2.

TABLE 2

| | Condition | Mobility ($cm^2$/Vs) | $I_{on/off}$ |
|---|---|---|---|
| PNDI2F3T (Synthesis Example 6) | Au electrode | 0.19 | |
| | Al electrode | 0.25 | |
| PDPP2F3T (Synthesis Example 8) | Au electrode | 0.1 | |
| | Al electrode | 0.13 | |
| Existing transistor [Comparative Example 1] | Adv. Funct. Mater. 2013, 24, 1151-1162 | 0.01 | — |
| Existing transistor [Comparative Example 2] | Adv. Funct. Mater. 2013, 24, 1151-1162 | $6.5 \times 10^{-4}$ | — |
| Existing transistor [Comparative Example 3] | Chem. Mater., 2013, 25, 2178-2183 | 0.05 | $10^4$-$10^5$ |

As seen from Table 2, the transistors using the organic semiconductor thin films (i.e., the conductive organic semiconductor compounds) of the present disclosure exhibit significantly improved performance as compared to the transistors using the existing conductive organic semiconductor compounds. For example, the polymers wherein fluorine-free thiophene was introduced instead of difluorothiophene to the PNDI2F3T (Synthesis Example 6) of the present disclosure (Comparative Example 1 and Comparative Example 2) showed charge mobility of 0.01 $cm^2$/Vs and $6.5 \times 10^{-4}$ $cm^2$/Vs, and the polymer wherein 2,1,3-benzothiadiazole was introduced instead of difluorothiophene showed charge mobility of 0.05 $cm^2$/Vs. In contrast, the polymer organic semiconductors according to the present disclosure showed 4 to tens of times increased charge mobility.

What is claimed is:

1. A conductive organic semiconductor compound represented by [Chemical Formula I] or [Chemical Formula II]:

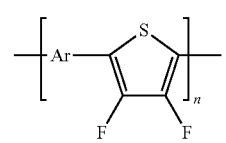

[Chemical Formula I]

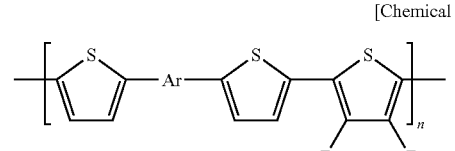

[Chemical Formula II]

wherein Ar is selected from [Structural Formula 1] and n is an integer from 5 to 100,000:

[Structural Formula 1]
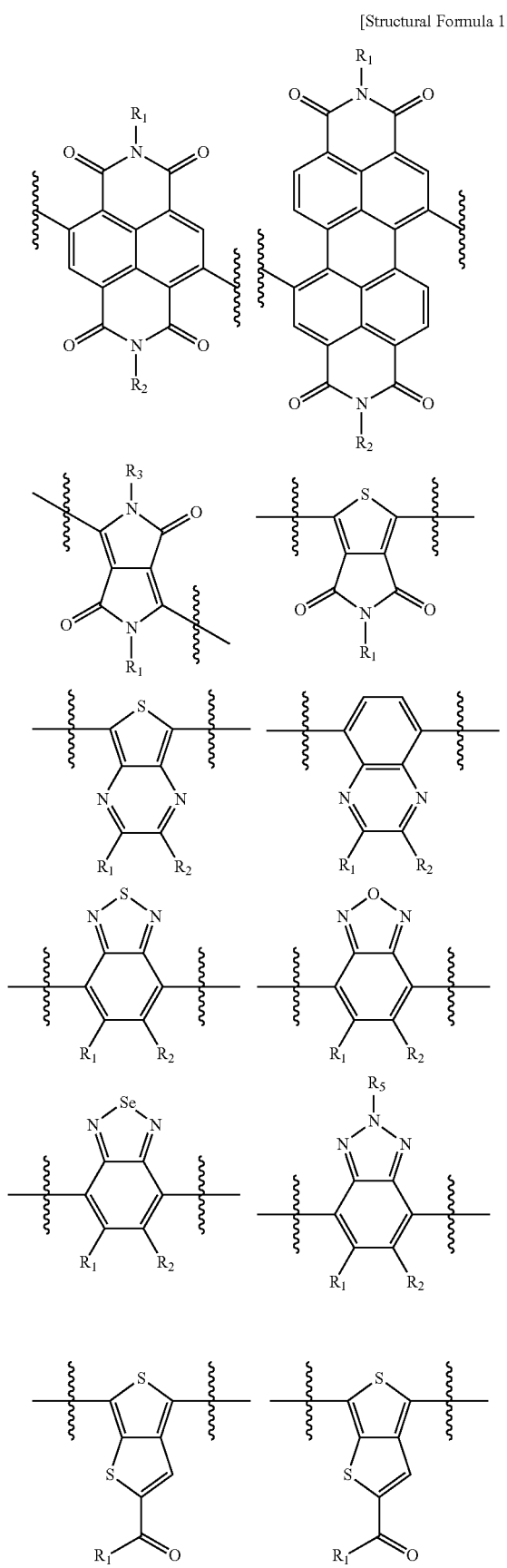
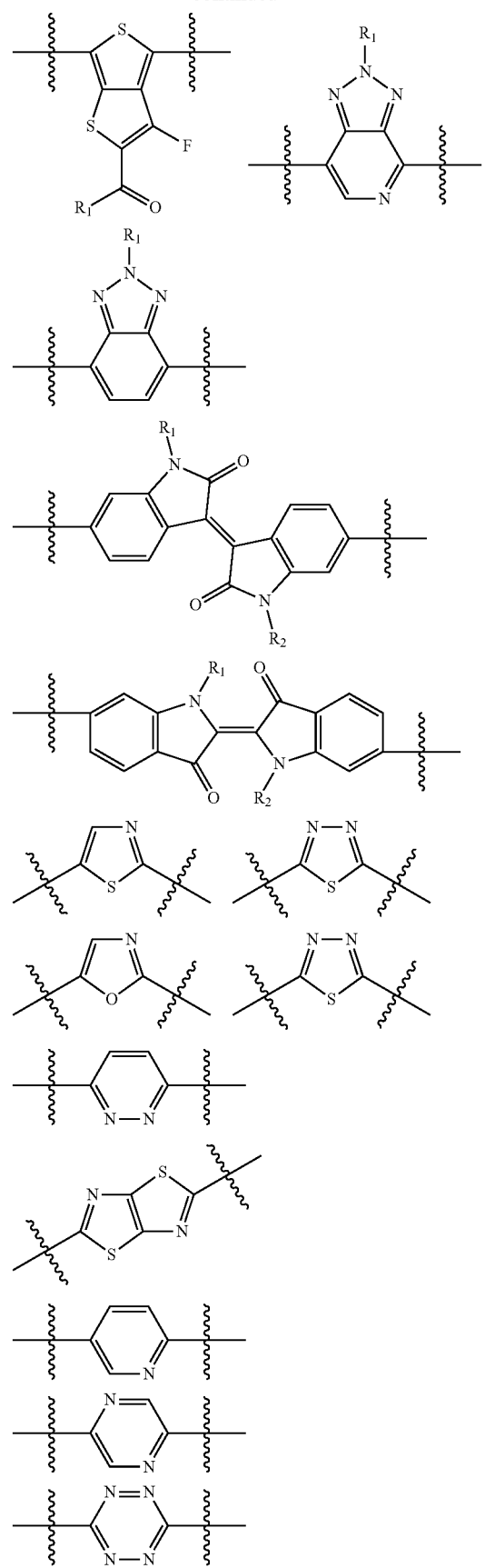

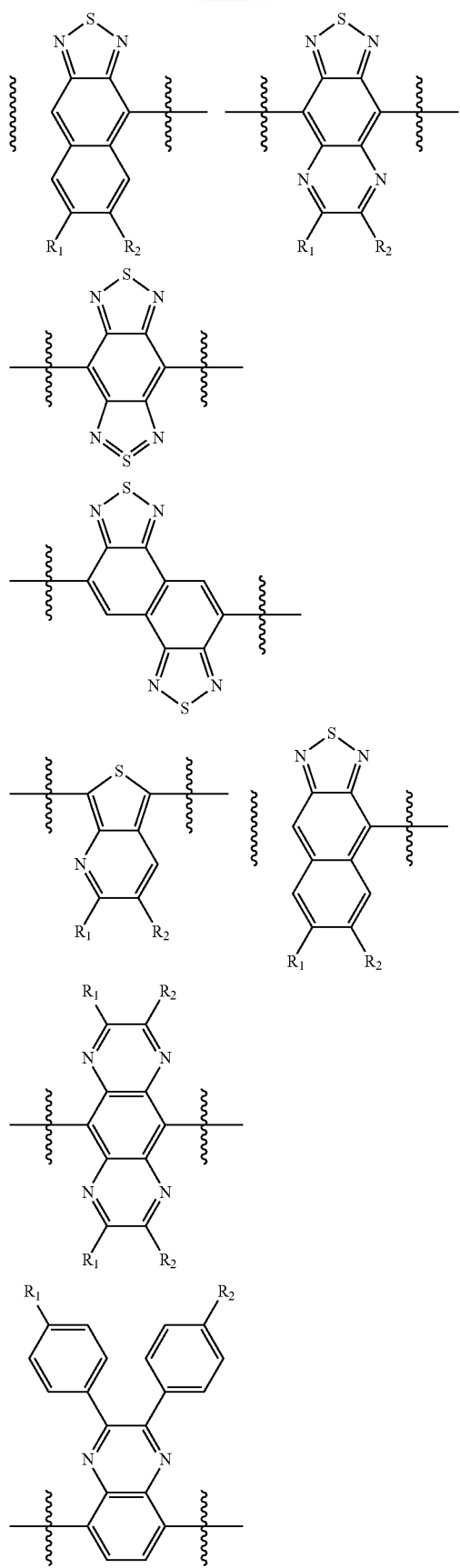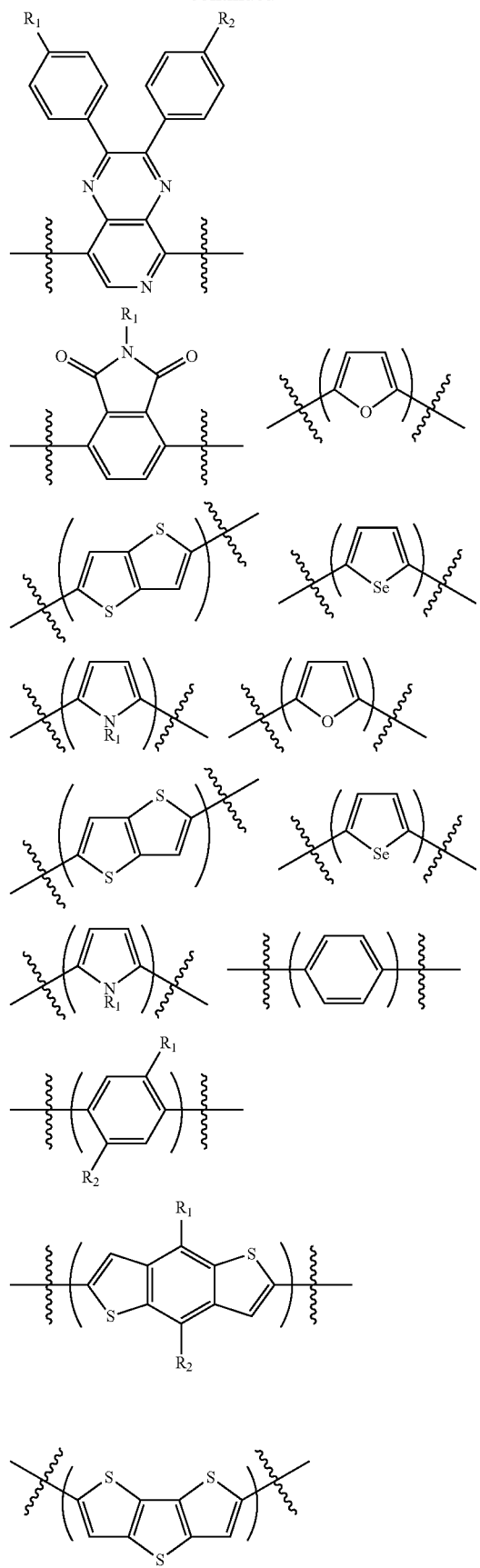

-continued

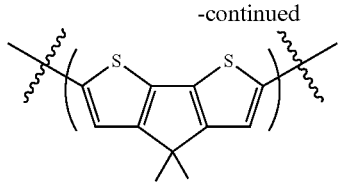

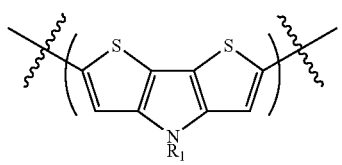

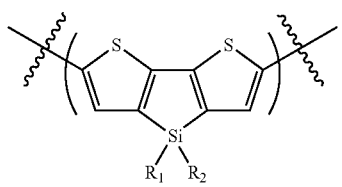

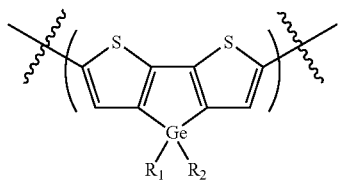

wherein each of R₁ and R₂, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group.

2. The conductive organic semiconductor compound according to claim 1, wherein [Chemical Formula II] is represented by [Chemical Formula III] or [Chemical Formula IV]:

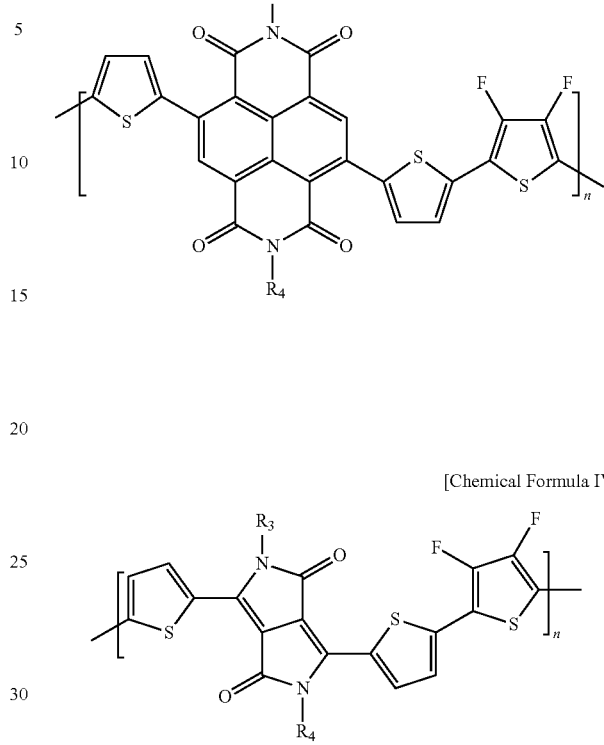

[Chemical Formula III]

[Chemical Formula IV]

wherein each of R₃ and R₄, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group, and n is an integer from 5 to 100,000.

3. The conductive organic semiconductor compound according to claim 2, wherein [Chemical Formula III] is represented by [Chemical Formula V]:

[Chemical Formula V]

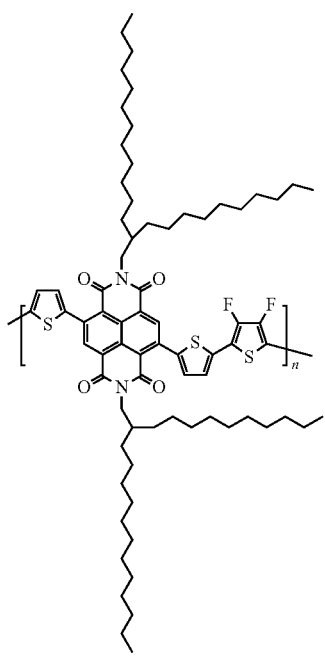

wherein n is an integer from 5 to 100,000.

4. The conductive organic semiconductor compound according to claim 2, wherein [Chemical Formula IV] is represented by [Chemical Formula VI]:

[Chemical Formula VI]

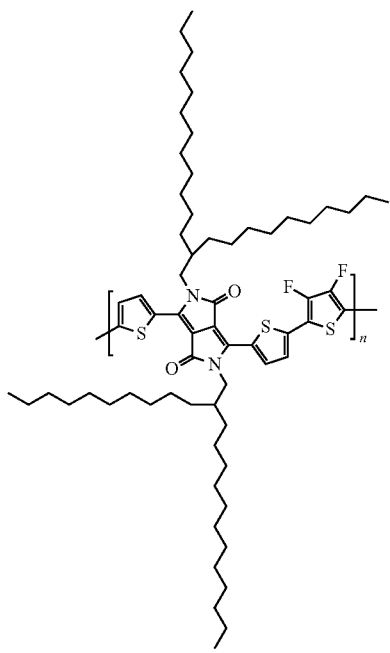

wherein n is an integer from 5 to 100,000.

5. The conductive organic semiconductor compound according to claim 1, wherein the conductive organic semiconductor compound has an electron mobility of $1\times10^{-6}$ cm$^2$/N·s or higher.

6. The conductive organic semiconductor compound according to claim 1, wherein the conductive organic semiconductor compound has a band gap of 1.0-3.0 eV.

7. An organic semiconductor thin film comprising one or more conductive organic semiconductor compound,
wherein the conductive organic semiconductor compound is represented by [Chemical Formula I] or [Chemical Formula II]:

[Chemical Formula I]

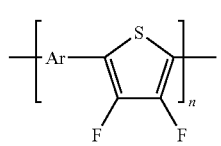

[Chemical Formula II]

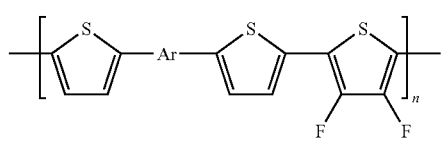

wherein Ar is selected from [Structural Formula 1] and n is an integer from 5 to 100,000:

[Structural Formula 1]

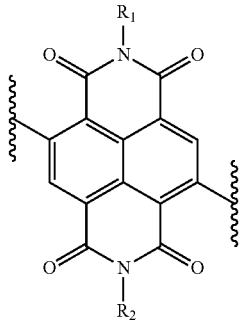 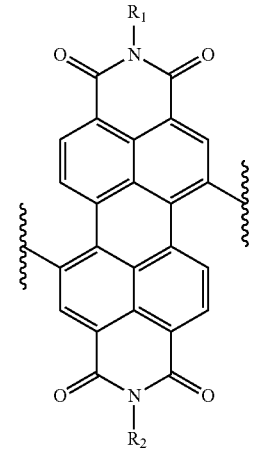

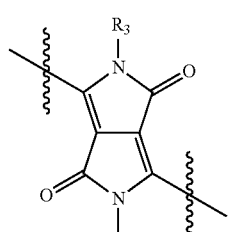 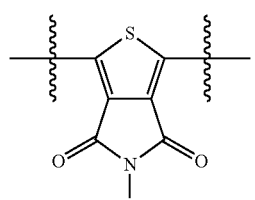

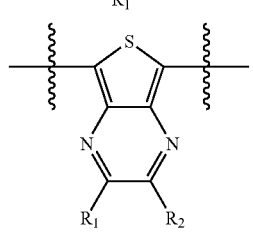 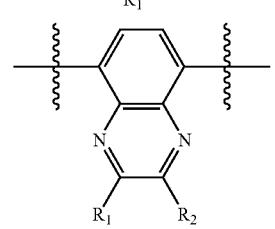

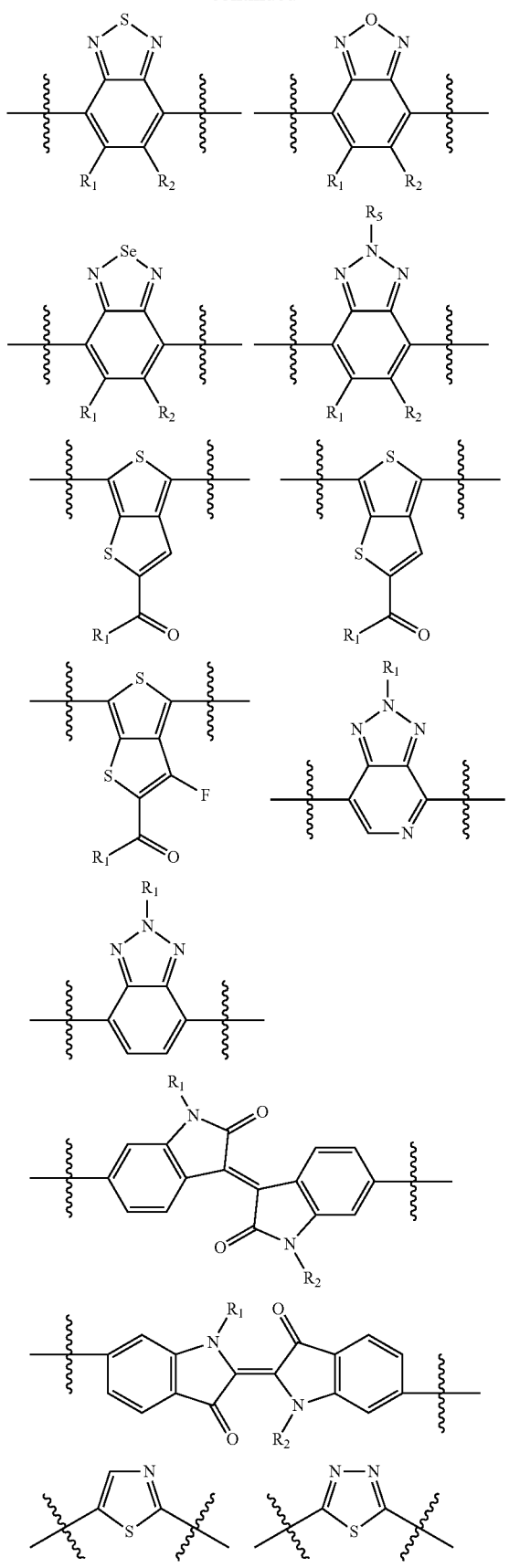
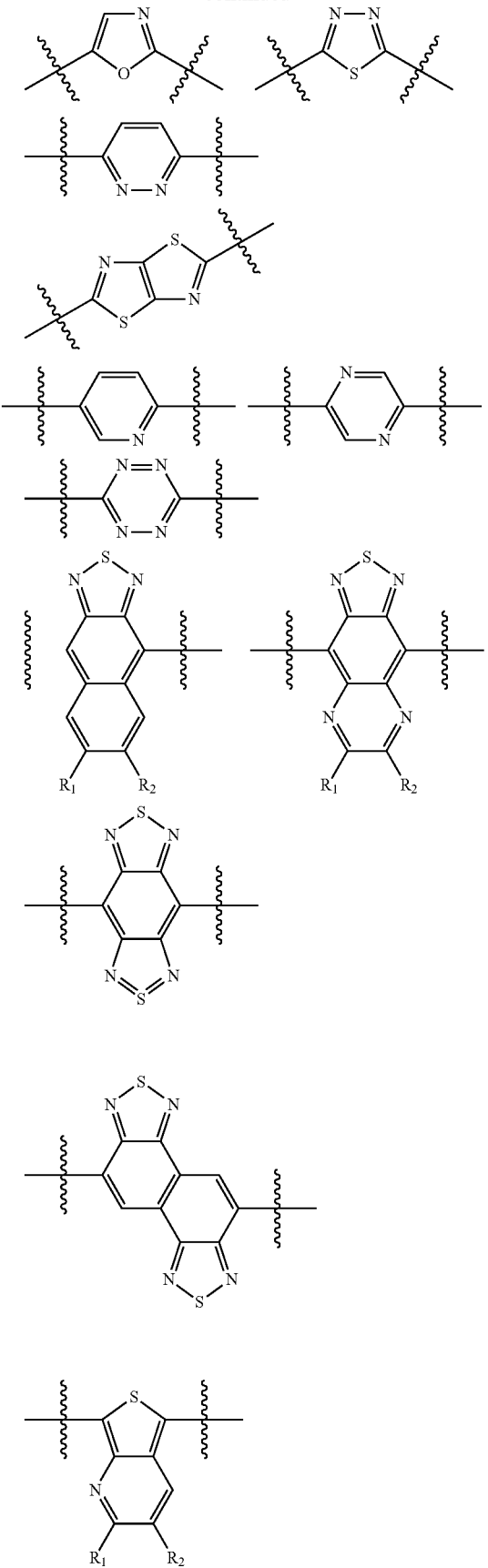

-continued

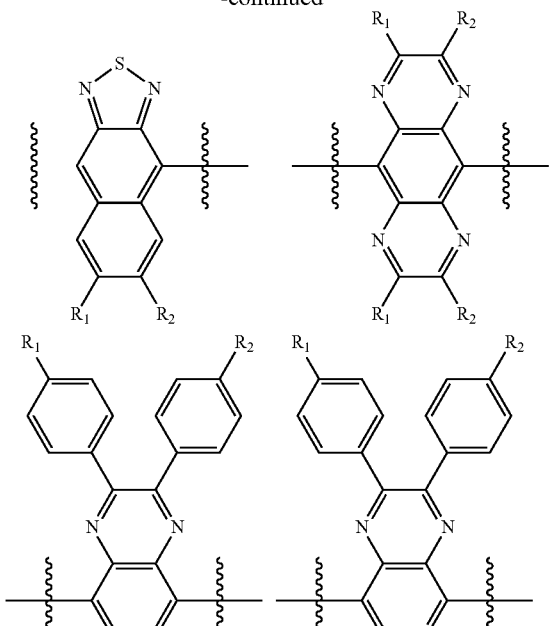

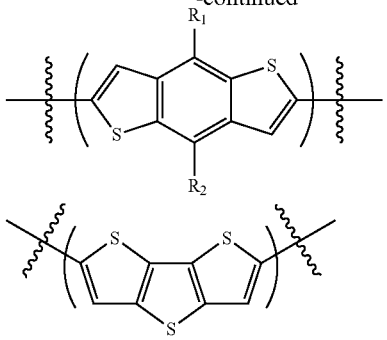

wherein
each of $R_1$ and $R_2$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group.

8. An organic thin-film transistor, comprising:
a substrate;
a gate electrode formed on the substrate;
an insulating layer formed on the gate electrode;
an organic semiconductor thin film formed on the insulating layer; and a source electrode layer and a drain electrode layer formed on the organic semiconductor thin film, wherein the organic semiconductor thin film includes one or more conductive organic semiconductor compound, wherein the conductive organic semiconductor compound is represented by [Chemical Formula I] or [Chemical Formula II]:

[Chemical Formula I]

[Chemical Formula II]

wherein Ar is selected from [Structural Formula 1] and n is an integer from 5 to 100,000:

[Structural Formula 1]

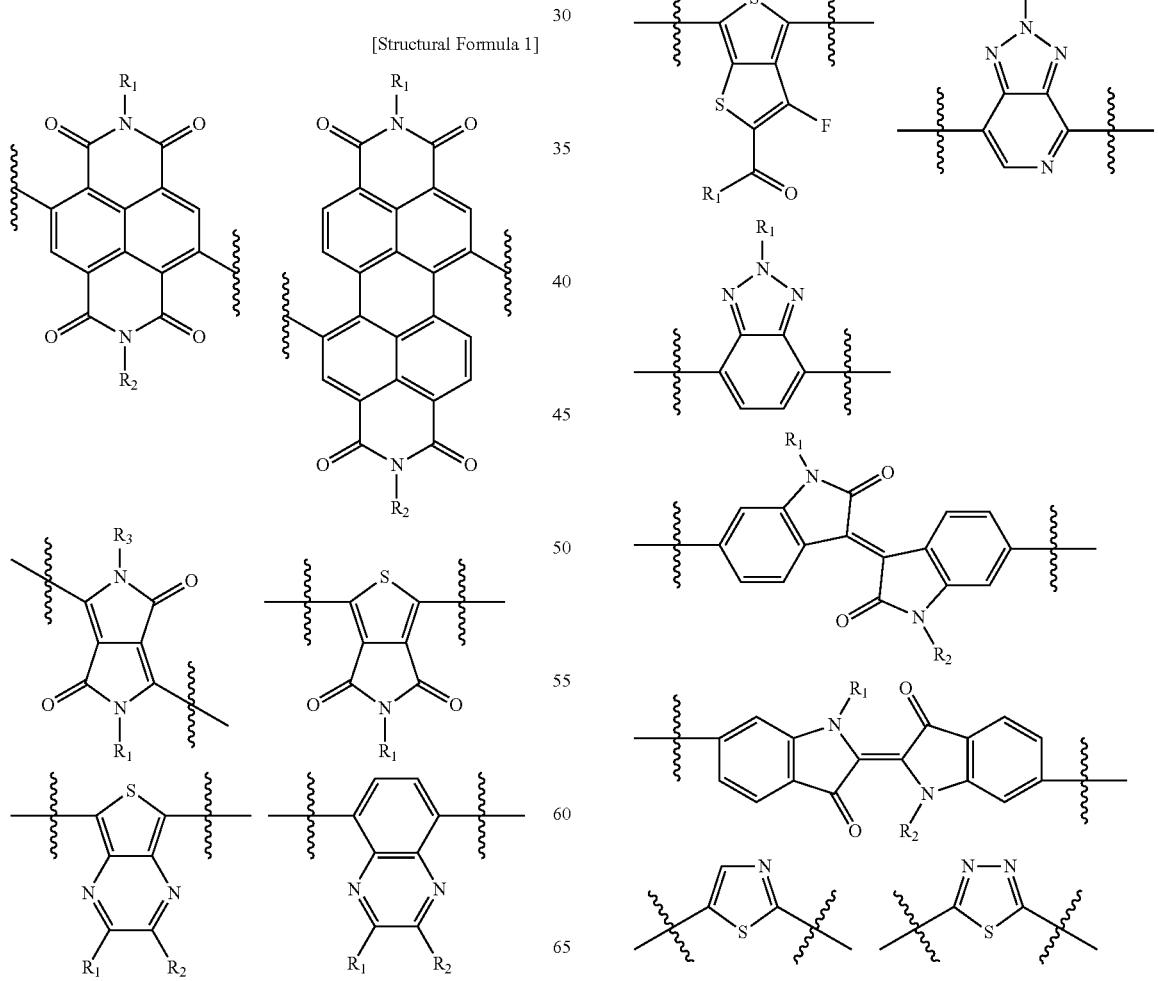

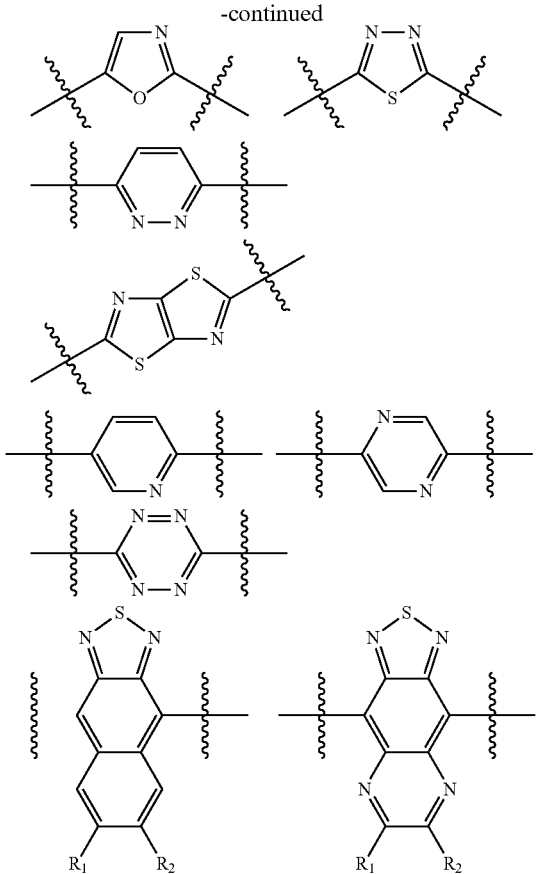
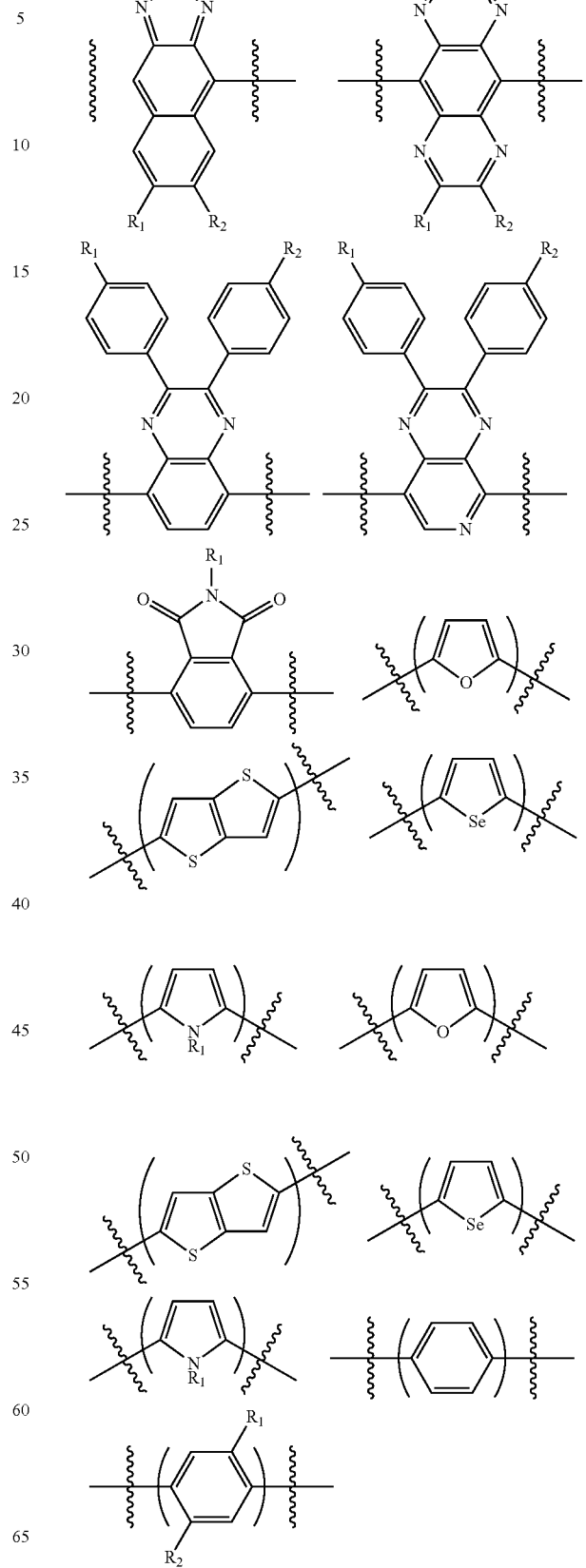

-continued

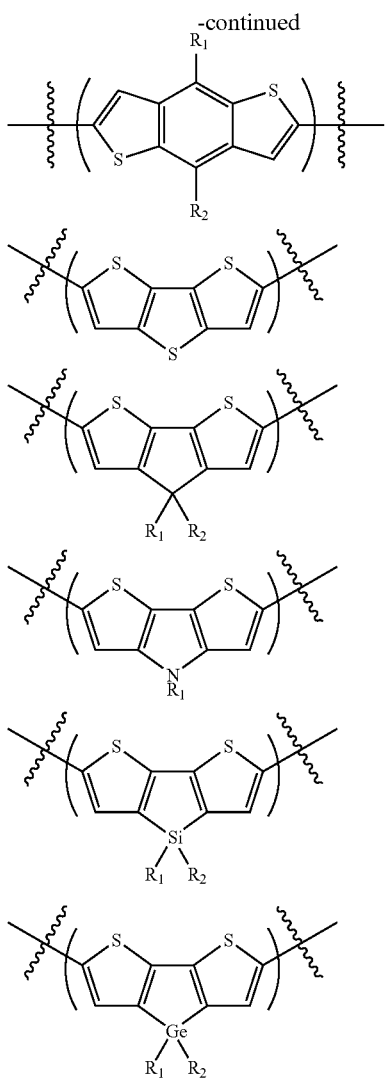

wherein
each of $R_1$ and $R_2$, which are identical or different, is independently selected from a group consisting of hydrogen, a halogen group, a cyano group, a nitro group, a hydroxyl group, an amide group, an ester group, a ketone group, a thioester group, a silyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_2$-$C_{50}$ heteroaryl group containing at least one of S, N, O, P and Si, a substituted or unsubstituted $C_3$-$C_{30}$ cycloalkyl group, a substituted or unsubstituted $C_3$-$C_{30}$ cycloalkenyl group, a substituted or unsubstituted $C_5$-$C_{50}$ aryl group, a substituted or unsubstituted $C_1$-$C_{30}$ alkoxy group, a substituted or unsubstituted $C_5$-$C_{50}$ aryloxy group, a substituted or unsubstituted $C_1$-$C_{30}$ alkylamino group, a substituted or unsubstituted $C_6$-$C_{30}$ arylamino group, a substituted or unsubstituted $C_1$-$C_{30}$ alkylsilyl group and a substituted or unsubstituted $C_5$-$C_{50}$ arylsilyl group.

9. The organic thin-film transistor according to claim 8, wherein the organic thin-film transistor has a top-contact or bottom-contact structure.

10. The organic thin-film transistor according to claim 8, wherein the gate electrode, the source electrode and the drain electrode are selected from a group consisting of gold, silver, aluminum, nickel, chromium and indium tin oxide.

11. The organic thin-film transistor according to claim 8, wherein the substrate is selected from a group consisting of glass, polyethylene naphthalate, polyethylene terephthalate, polycarbonate, polyvinyl alcohol, polyacrylate, polyimide, polynorbornene and polyethersulfone.

12. The organic thin-film transistor according to claim 8, wherein the insulating layer is selected from a group consisting of $Ba_{0.33}Sr_{0.66}TiO_3$ (BST), $Al_2O_3$, $Ta_2O_5$, $La_2O_5$, $Y_2O_3$, $TiO_2$, $PdZr_{0.33}Ti_{0.66}O_3$ (PZT), $Bi_4Ti_3O_{12}$, $BaMgF_4$, $SrBi_2(TaNb)_2O$, $Ba(ZrTi)O_3$(BZT), $BaTiO_3$, $SrTiO_3$, $Bi_4Ti_3O_{12}$, $SiO_2$, $SiN_x$, AlON, polyimide, BCB, parylene, polyacrylate, polyvinyl alcohol and polyvinylphenol.

* * * * *